(12) United States Patent
Akimoto et al.

(10) Patent No.: US 7,245,348 B2
(45) Date of Patent: Jul. 17, 2007

(54) COATING AND DEVELOPING SYSTEM AND COATING AND DEVELOPING METHOD WITH ANTIREFLECTION FILM AND AN AUXILIARY BLOCK FOR INSPECTION AND CLEANING

(75) Inventors: Masami Akimoto, Koshi-Machi (JP); Shinichi Hayashi, Koshi-Machi (JP); Yasushi Hayashida, Koshi-Machi (JP); Nobuaki Matsuoka, Koshi-Machi (JP); Yoshio Kimura, Koshi-Machi (JP); Issei Ueda, Koshi-Machi (JP); Hikaru Ito, Minato-Ku (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 11/117,566

(22) Filed: Apr. 29, 2005

(65) Prior Publication Data

US 2006/0164613 A1 Jul. 27, 2006

(30) Foreign Application Priority Data

Jan. 21, 2005 (JP) .............................. 2005-014716

(51) Int. Cl.
*G03B 27/52* (2006.01)
(52) U.S. Cl. ...................................................... 355/27
(58) Field of Classification Search ................. 355/27, 355/53; 396/611; 118/54
See application file for complete search history.

(56) References Cited

U.S. PATENT DOCUMENTS

| 6,722,798 B2* | 4/2004 | Senba et al. ................. 396/611 |
| 6,893,171 B2* | 5/2005 | Fukutomi et al. ........... 396/611 |

FOREIGN PATENT DOCUMENTS

| JP | 3337677 | 8/2002 |
| JP | 2004-193597 | 7/2004 |

\* cited by examiner

*Primary Examiner*—Peter B. Kim
*Assistant Examiner*—Michael Liu
(74) *Attorney, Agent, or Firm*—Oblon, Spivak, McClelland, Maier & Neustadt, P.C.

(57) ABSTRACT

A coating and developing system includes an auxiliary block, a resist film forming unit block and antireflection film forming unit blocks stacked up in layers to form a resist film and an antireflection film underlying the resist film and an antireflection film overlying the resist film in a small space. The coating and developing system can cope with either a case where antireflection films are formed or a case where no antireflection film is formed. Film forming unit blocks, namely, a TCT layer, a COT layer and a BCT layer, and developing unit blocks, namely, DEV layers, are stacked up in layers in a processing block S2. The TCT layer, the COT layer and the BCT layer are used selectively in the case where antireflection films are formed and the case where any antireflection film is not formed. The coating and developing system is controlled by a carrying program.

27 Claims, 12 Drawing Sheets

| B5 BCT LAYER | COL5 | CHP5 | CHP5 | CHP5 |
|---|---|---|---|---|
| | COL5 | COL5 | CHP5 | CHP5 |

| B4 COT LAYER | COL4 | CHP4 | CHP4 | WEE |
|---|---|---|---|---|
| | COL4 | COL4 | CHP4 | ADH |

| B3 TCT LAYER | COL3 | CHP3 | CHP3 | WEE |
|---|---|---|---|---|
| | COL3 | COL3 | CHP3 | CHP3 |

| B2 DEV LAYER | POST2 | POST2 | PEB2 | PEB2 |
|---|---|---|---|---|
| | POST2 | PEB2 | COL2 | COL2 |

| B1 DEV LAYER | POST1 | POST1 | PEB1 | PEB1 |
|---|---|---|---|---|
| | POST1 | PEB1 | COL1 | COL1 |

FIG. 5

COATING AND DEVELOPING SYSTEM AND COATING AND DEVELOPING METHOD WITH ANTIREFLECTION FILM AND AN AUXILIARY BLOCK FOR INSPECTION AND CLEANING

BACKGROUND OF THE INVENTION

1. Field of the Invention

The present invention relates to a coating and developing system for applying a liquid resist to a surface of a substrate, such as a semiconductor wafer or a LCD substrate, namely, a glass substrate for a liquid crystal display, to coat the surface with a resist film and developing the exposed resist film, and a coating and developing method.

2. Description of the Related Art

In a manufacturing process for manufacturing semiconductor devices or LCD panels, a resist pattern is formed on a substrate by a photolithographic process. The photolithographic process includes a series of steps of forming a resist film on a substrate, such as a semiconductor wafer (hereinafter, referred to simply as "wafer") by applying a liquid resist to the surface of the substrate, exposing the resist film to light through a photomask, and developing the exposed resist film to form a desired resist pattern.

Generally, this photolithographic process is carried out by a resist pattern forming system built by combining an exposure system with a coating and developing system. FIG. 12 shows a known resist pattern forming system of this type disclosed in, for example, Patent document 1. Referring to FIG. 12, a carrier 10 holding a plurality of wafers W is delivered onto a carrier stage 11 installed in a carrier handling block 1A, and then a transfer arm 12 transfers the wafer W from the carrier 10 to a processing block 1B. The wafer W is delivered to a coating unit 13A installed in the processing block 1B. The coating unit 13A applies a liquid resist to a surface of the wafer W in a resist film. Subsequently, the wafer coated with the resist film is carried via an interface block 1C to an exposure system 1D.

The wafer W is returned to the processing block 1B after being subjected to an exposure process. A developing unit 13B subjects the wafer W to a developing process, and then the wafer W is returned to the carrier 10. Indicated at 14 (14a to 14c) in FIG. 12 are shelf units including a heating unit for processing a wafer by a predetermined heating process, a cooling unit for processing the wafer by a predetermined cooling process and a transfer stage. Each of the shelf units processes a wafer before or after the wafer is processed by the coating unit 13A and the developing unit 13B. Each of two carrying devices 15A and 15B installed in the processing block 1B carries a wafer W in the processing block 1B from one to another of modules in which the wafer W is to be placed, such as the coating unit 13A, the developing unit 13B and the shelf units 14a to 14c. Each of all the wafers W to be processed by the foregoing processes is carried to desired modules according to a carrying schedule specifying time points when the wafer W is to be carried to the modules.

Resist films of different types are formed in different coating mode, respectively. A first coating mode forms a resist film and antireflection films over and under the resist film, a second coating mode forms a resist film and an antireflection film over or under the resist film, and a third coating mode forms only a resist film. Therefore, in some cases, the units necessary for forming films, such as the coating unit, the heating unit and the cooling unit, processes wafers of different lots under different processing conditions. In such a case, a complex carrying program must be prepared for each type of the resist film when the coating unit, the heating unit and the cooling unit are installed in the same processing block because the different types of resist films are formed by using different units and are carried along different carrying paths. Since carrying programs to be produced according to the carrying schedule are originally complex, work for producing a carrying program for each of desired resist films is very complex and troublesome and such work is practically impossible.

When many units including the coating unit, the heating unit and the cooling unit are installed in the same processing block, the processing block is inevitably large and occupies a large area. A recent exposure system operates at a high throughput. Consequently, the coating and developing system is required to have a high processing ability corresponding to the throughput of the exposure system. However, the same carrying system operates to carry a wafer W to the coating unit for forming a resist film before the exposure process. Because the same carrying system operates to carry a wafer to an antireflection film forming unit for forming the antireflection film and to carry a wafer coated with an exposed resist film to the developing unit after exposure, it is difficult to operate the exposure system at a high throughput.

The inventors of the present invention have been making studies to develop a multilayer system including an area holding modules for processes preceding an exposure process and an area holding modules for containing modules for carrying out processes succeeding the exposure process disposed in a vertical arrangement to reduce load on carrying means, to improve carrying efficiency, to increase the throughput of a coating and developing system. Construction which disposes a coating area for a coating process and a developing area for a developing process in a vertical arrangement is disclosed in Patent document 2.

Although studies have been made on a multilayer system in which a coating area and a developing area are formed in different layers, respectively, to simplify constitution by reducing carrying systems, and to simplify a carrying program, nothing is mentioned in Patent document 2 about such improvements.

Patent document 1: JP 2004-193597 A
Patent document 2: Jpn. Pat. No. 3337677

SUMMARY OF THE INVENTION

The present invention has been made under such circumstances and it is therefore an object of the present invention to provide techniques for forming antireflection films over and under a resist film, capable of reducing necessary space. Another object of the present invention is to provide techniques capable of dealing with either of a case where an antireflection film is formed and a case where any antireflection film is not formed and of simplifying software.

A coating and developing system according to the present invention includes: a carrier handling block for receiving a substrate carried thereto by a carrier; a processing block for processing the substrate transferred thereto from the carrier handling block to form films including a resist film on the substrate; an interface block for carrying the substrate to an exposure system, receiving the substrate processed by the exposure system and returning the substrate to the processing block to subject the substrate to a developing process and to transfer the substrate processed by the developing process to the carrier handling block; wherein a) the processing block is provided with a plurality of film forming unit blocks stacked up in layers and a developing unit block put on the film forming unit blocks, b) the plurality of film forming unit blocks stacked up in layers include a liquid resist applying unit block for applying a liquid resist to the substrate, a liquid-processing unit block for applying a chemical solution for forming an antireflection film to the substrate before the liquid resist is applied to the substrate, and a liquid-processing unit block for applying a chemical solution for forming an antireflection film to the substrate after the liquid resist has been applied to the substrate; c) each of the unit blocks includes a liquid-processing unit for applying a chemical solution to the substrate, a heating unit for heating the substrate, a cooling unit for cooling the substrate, and a carrying means for carrying the substrate from one to another of the liquid-processing unit, the heating unit and the cooling unit, and d) a transfer stage group including transfer stages, via which a substrate is transferred to the carrying means of the unit blocks, stacked up in layers is disposed on the side of the carrier handling block so as to correspond to the unit blocks, and a substrate transfer means carries a substrate from one to another of the transfer stages. The substrate transfer means transfers a substrate on which a film has been formed by the film forming unit block to the developing unit block, and the carrying means of the developing unit block carries the substrate to the interface block.

The transfer stage group may be disposed on the side of the interface block. When the transfer stage group is disposed on the side of the interface block, a substrate contained in a carrier delivered to the carrier handling block is transferred to the developing unit block, and then the substrate is transferred to the film forming unit block by the substrate transfer means.

The coating and developing system may include carrying recipes respectively specifying carrying routes along which a substrate is carried in the unit blocks, a carrying mode selecting means for selecting one of a first carrying mode in which a substrate is carried to all the unit blocks, a second carrying mode in which a substrate is carried to the liquid resist applying unit block, the liquid-processing unit block for applying a chemical solution for forming an antireflection film to the substrate before the liquid resist is applied to the substrate and the developing unit block for carrying out a developing process and a third carrying mode in which a substrate is carried to the liquid resist applying unit block, the liquid-processing unit block for applying a chemical solution for forming an antireflection film to the substrate after the liquid resist has been applied to the substrate, the mode selecting means may select the unit blocks to which a substrate is to be carried, and the carrying recipes to be used by the selected unit blocks may be selected for processing.

Preferably, the coating and developing system includes a transfer stage group of transfer stages stacked up in layers so as to correspond to the unit blocks, respectively, such that a substrate is transferred to and received from the carrying means of the unit blocks via the transfer stages, and the transfer means transfers a substrate from one to another of the transfer stages. The transfer stage group may be disposed on the side of the carrier handling block, and the transfer stage group may include a transfer stage for the carrier handling block to transfer a wafer from the carrier handling block to the processing block and to transfer a substrate reversely. The transfer stage group may be disposed on the side of the interface block, and the transfer stage group may include a transfer stage for the interface block to transfer a substrate from the processing block to the interface block and to transfer a substrate reversely.

Preferably, the liquid-processing units included in the film forming unit block are arranged in a common processing vessel, and the liquid-processing units include laterally arranged substrate holding devices respectively for holding a plurality of substrates and a common chemical solution pouring nozzle placed in the processing vessel to pour a chemical solution to the plurality of substrates held by the plurality of substrate holding devices.

An auxiliary block provided with functional units, which carries out processes after a film forming process and before an exposure process and/or after the exposure process and before the developing process and after the developing process, may be interposed between the processing block and the interface block. The functional units of the auxiliary block may include at least one of a film thickness examining unit for examining the thickness of a film formed on a substrate, a cleaning unit for cleaning a substrate before the exposure process and/or after the exposure process, a defocus inspecting device for finding a faultily registered pattern occurred in the exposure system, an irregular coating detecting device for detecting irregularities in a liquid resist film, a faulty development detecting device for detecting defects in a developed film, a particle counting device for counting particles adhering to a substrate, a comet detecting device for detecting comets in a resist film formed on a substrate, a splash-back detecting device, a defect detecting device for detecting defects in the surface of a substrate, a scum detecting device for detecting residual resist remaining on a substrate processed by a developing process, a defect detecting device for detecting defects caused by a liquid resist applying process and/or a developing process, a line width measuring device for measuring lines of a patterned resist film formed on a substrate, and a register examining device for examining the register of a photomask on a substrate after an exposure process. When the exposure system forms a liquid layer on the surface of a substrate for immersion exposure, the functional unit of the auxiliary block may be a cleaning unit for cleaning a substrate processed by immersion exposure.

A film forming unit block for forming a water-repellent protective film over a resist film formed on a substrate may be laid on the plurality of stacked film forming unit blocks. Preferably, the plurality film forming unit blocks of the coating and developing system are the same in the layout of the liquid-processing unit, the heating unit, the cooling unit and the carrying means.

The coating and developing system carries out a coating and developing method including the steps of: forming a first antireflection film on a surface of a substrate by the film forming unit block; forming a resist film by applying a liquid resist to the first antireflection film formed on the surface of the substrate by the film forming unit block placed on a layer other than that on which the film forming unit block formed by the first antireflection film is placed; forming a second antireflection film over the resist film by the film forming unit block placed on a layer other than those on which the film forming unit blocks respectively formed by the first antireflection film and the resist film are placed; and subjecting the substrate coated with the resist film and processed by an exposure process to a developing process by a developing unit block placed on a layer other than those on which those film forming unit blocks are placed.

The coating and developing system carries out a coating and developing method including the steps of: selecting one of a first carrying mode in which a substrate is carried to all the film forming unit blocks, a second carrying mode in which a substrate is carried to the liquid resist applying unit block and to a liquid-processing unit block for forming an antireflection film before a resist film is formed on a substrate, and a third carrying mode in which a substrate is carried to the liquid resist applying unit block for applying a liquid resist to the substrate and to the liquid-processing unit block for applying a chemical solution for forming an antireflection film to the substrate after the liquid resist has been applied to the substrate; forming films on the substrate by carrying the substrate from one to another of the film forming unit blocks in the selected carrying mode; and subjecting the substrate coated with the films and processed by an exposure process to a developing process by a developing unit block on a layer other than those on which those film forming unit blocks are placed.

According to the present invention, the plurality of stacked film forming unit blocks include a resist film forming unit block for forming a resist film on a substrate, an antireflection film forming unit block for forming an antireflection film on a substrate before a resist film is formed on the substrate, and an antireflection forming unit block for forming an antireflection film over a resist film formed on a substrate, and those film forming unit blocks are stacked up in layers. The processing block capable of forming antireflection films over and under a resist film occupies a small area and needs a small space for installation.

The coating and developing system is capable of dealing with either of a process that forms an antireflection film and a process that does not form any antireflection film by selectively using the film forming unit blocks. Since a substrate is carried along the same substrate carrying routes in all the unit blocks, a substrate can be carried according to a simple carrying program even in a case where the coating and developing system forms different films and hence software is simplified.

Since the exclusive substrate transfer means capable of accessing all the unit blocks transfers a substrate from the unit block on one layer to the unit block on another layer, the degree of freedom of transfer of a substrate from one to another layer is large, the constitution of the system is simplified and the carrying program can be easily simplified.

According to another aspect of the present invention, a plurality of liquid-processing units for applying a chemical solution to a substrate are contained in a common processing vessel, the processing units can be operated in the same processing atmosphere, and a temperature control system and a chemical solution applying nozzle can be used in common by all the processing units.

BRIEF DESCRIPTION OF THE DRAWINGS

FIG. 5 is a front elevation showing the layout of the components of a heating and cooling system included in the coating and developing system shown in FIG. 1;

DESCRIPTION OF THE PREFERRED EMBODIMENTS

Figure 1:
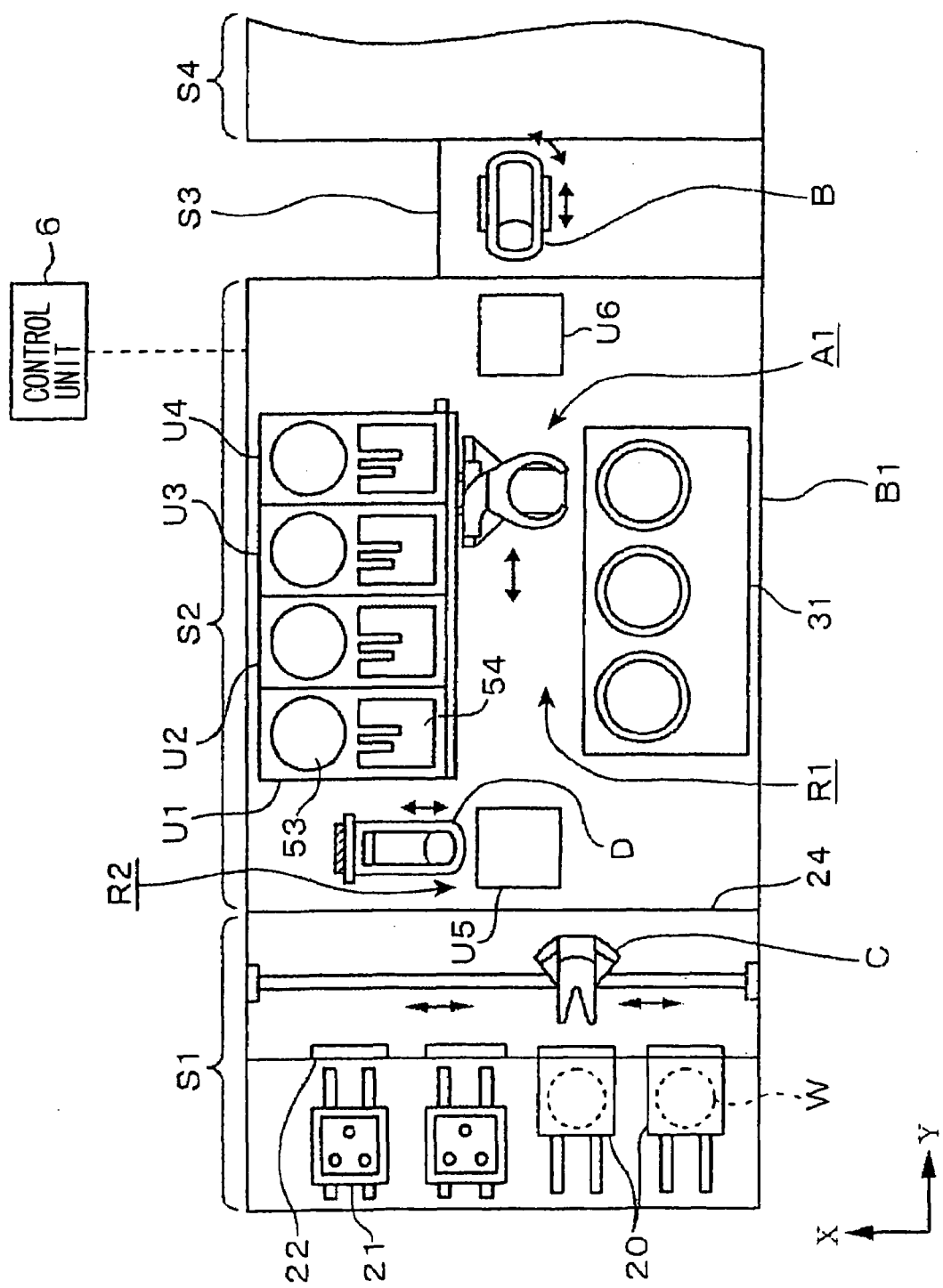
FIG. 1 is a schematic plan view of a coating and developing system in a first embodiment according to the present invention.
Figure 2:
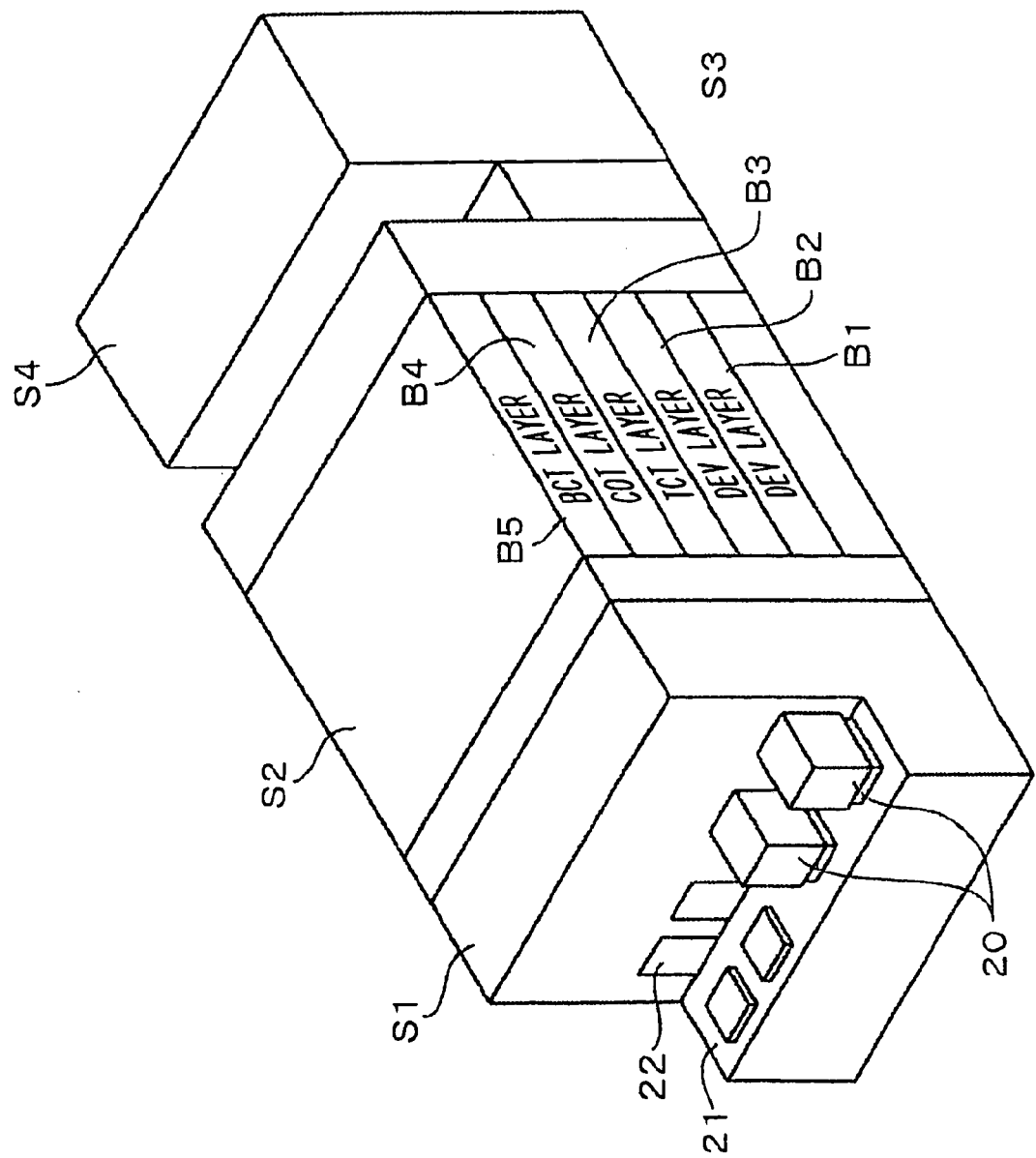
FIG. 2 is a schematic perspective view of the coating and developing system shown in FIG. 1.
Figure 3:
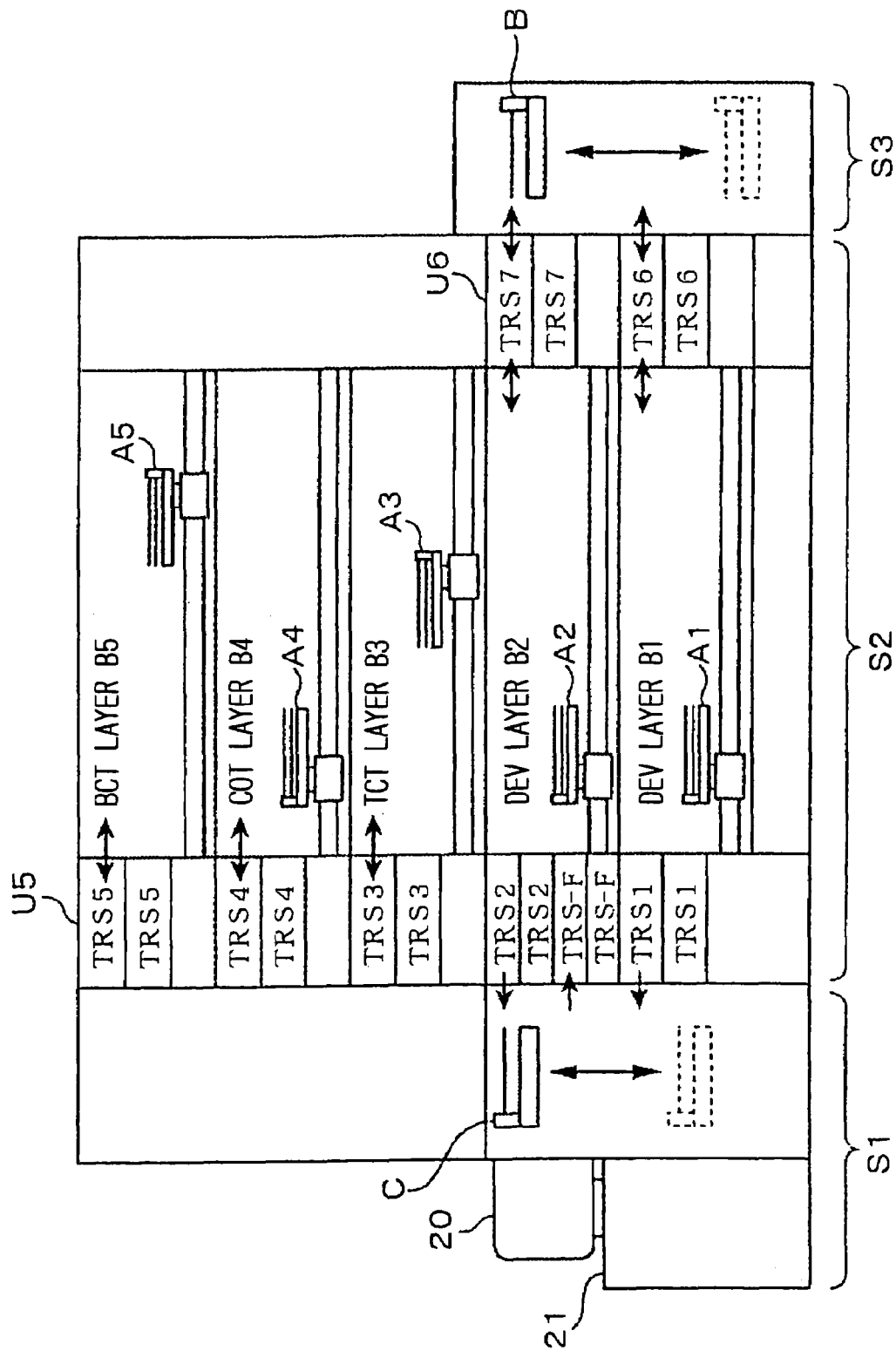
FIG. 3 is a schematic sectional side elevation of the coating and developing system shown in FIG. 1.

A coating and developing system in a first embodiment according to the present invention will be described. FIG. 1 is a schematic plan view of a coating and developing system in a first embodiment according to the present invention to be used as a resist pattern forming system, FIG. 2 is a schematic perspective view of the coating and developing system and FIG. 3 is a schematic sectional side elevation of the coating and developing system. The coating and developing system has a carrier handling block S1 for receiving a closed carrier 20 holding, for example, thirteen wafers W, namely, substrates, and sending the same out, a processing block S2 including, for example, five vertically arranged unit blocks B1 to B5, and an interface block S3. An exposure system S4 is connected to the interface block S3.

The carrier handling block S1 has a carrier support table 21 capable of supporting a plurality of carriers 20 thereon, gates 22 formed in a wall behind the carrier support table 21, and a transfer arm C capable of extending through the gate 22 to the carrier 20 to take out the wafer W from the carrier 20. The transfer arm C is able to move in horizontal directions and vertical directions, to turn about a vertical axis and to move in directions parallel to a direction in which the carriers 20 are arranged to carry the wafer W from one to another of transfer stages TRS1 and TRS2 of unit blocks B1 and B2.

The processing block S surrounded by a casing 24 is connected to the back end of the carrier handling block S1. In this embodiment, the processing block S2 includes a first unit block (first DEV layer) B1 for carrying out a developing process, a second unit block (second DEV layer) B2 for carrying out a developing process, a third unit block (TCT layer) B3 for carrying out an antireflection film forming process for forming a first antireflection film over a resist film, a fourth unit block (COT layer) B4 for carrying out a liquid resist applying process, and a fifth unit block (BCT layer) B5 for carrying out an antireflection film forming process for forming a second antireflection film under the resist film. The unit blocks B1 to B5 are arranged vertically upward in that order. The DEV layers B1 and B2 are developing unit blocks, the TCT layer B3, the COT layer B4 and the BCT layer B5 are film forming unit blocks.

The construction of the first to the fifth unit block B (the blocks B1 to B5) will be described. The unit blocks B1 to B5 are provided with main arms A1 to A5, respectively. Each of the unit blocks B1 to B5 is provided with a liquid-processing unit for applying a chemical solution to the wafer W, a heating unit and a cooling unit for carrying out a pretreatment and a post-treatment before and after a process to be carried out by the liquid-processing unit. The main arms A1 to A5 are exclusive carrying means for carrying the wafer W from one to another of the liquid-processing units, the heating units and the cooling units.

The unit blocks B1 to B5 are the same in the layout of the liquid-processing unit, the heating unit, the cooling unit, and the carrying means; that is, the centers of spin chucks for holding the wafer W of the liquid-processing units are aligned, the centers of heating plates of the heating units are aligned and the centers of cooling plates in the cooling units are aligned.

The DEV layers B1 and B2 are the same in constitution and hence the DEV layer B1 shown in FIG. 1 will be described by way of example. A carrying area R1 extending in a substantially central part of the DEV layer B1 along the length of the DEV layer B1 parallel to the Y-axis in FIG. 1 connects the carrier handling block S1 and the interface block S3. The wafer W is carried in the carrying area R1.

A developing unit 31, namely, a liquid-processing unit, provided with a plurality of developing devices for processing the wafer W by a developing process is disposed on the right-hand side, as viewed from the side of the carrier handling block S1, of the carrying area R1. Each of the unit blocks is provided with four shelf units U1, U2, U3 and U4 arranged in that order on the left side of the carrying area R1. The shelf units U1, U2, U3 and U4 have heating units and cooling units stacked up in layers. Different processing units for treating the wafer W before and after the wafer W is processed by the developing unit 31 by a pretreatment and a post-treatment are stacked up, for example, in tow layers. Clean air is circulated through the carrying area R1 thus demarcated by those units to reduce particles floating in the carrying area R1.

Figure 4:
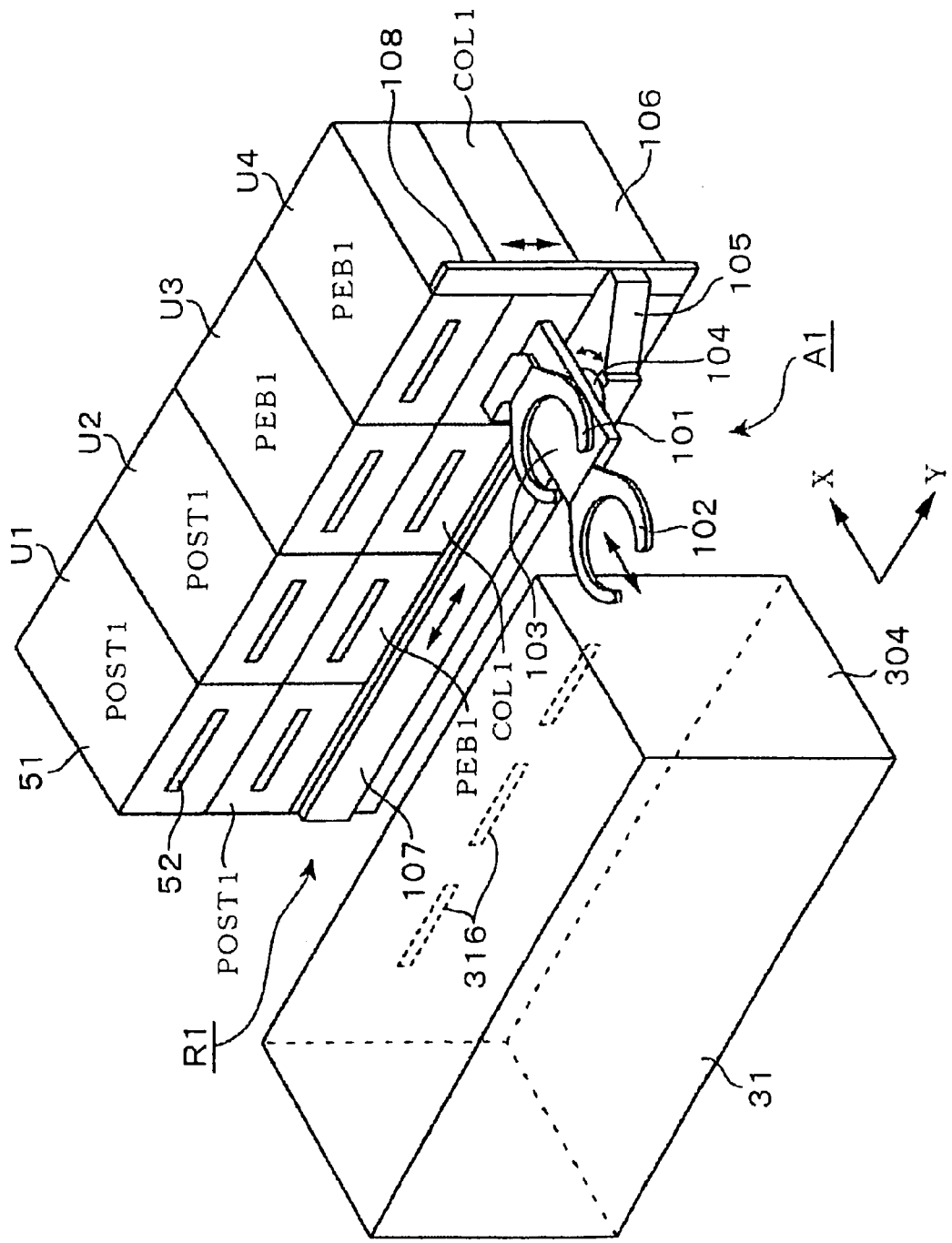
FIG. 4 is a perspective view of a developing unit, shelf units and a carrying device included in the coating and developing system shown in FIG. 1.

For example, the processing units for carrying out the pretreatment and the post-treatment include heating units (PEB1) called post-exposure baking units for carrying a heating process after the wafer W has been processed by an exposure process, cooling units (COL1) for adjusting the temperature of the wafer W to a predetermined temperature after the wafer W has been heated by the heating units (PEB1), and heating units (POST1) called post-baking units for processing the wafer W by a heating process to dry up the wafer after the wafer W has been processed by a developing process as shown in FIG. 4. The processing units, such as the heating units (PEB1 and POST1) and the cooling units (COL1) are placed in processing vessels 51, respectively. The processing vessels 51 are stacked up in two layers in each of the shelf unit U1 to U4. A wall, facing the carrying area R1, of each processing vessel 51 is provided with a gate 52 through which the wafer W is carried into and carried out of the processing vessel 51.

The main arm A1 operates in the carrying area R1. The main arm A4 is capable of carrying the wafer W from one to another of all the modules, in which the wafer W is placed, of the DEV layer B1, namely, the processing units of, for example, the shelf units U1 to U4, the developing unit 31, and shelf units U5 and U6. The main arm A4 is movable in horizontal directions and vertical directions, is turnable about a vertical axis and is movable along the Y-axis.

A local area, contiguous with the carrier handling block S1, of the carrying area R1 is a first transfer area R2. As shown in FIGS. 1 and 3, the shelf unit U5 is disposed in the transfer area R2 such that the transfer arm C and the main arm A1 are able to gain access to the shelf unit U5. A transfer arm D, namely, a transfer means, is disposed in the first transfer area R2 to deliver the wafer W to and to receive the wafer W from the shelf unit U5.

Referring to FIG. 3, the shelf unit U5 is provided with two transfer stages TRS1, two transfer stages TRS2, two transfer stages TRS3, two transfer stages TRS4 and two transfer stages TRS5 respectively for the unit blocks B1 to B5 to transfer the wafers W from the shelf unit U5 to each of the main arms A1 to A5 and to transfer the wafers W reversely. Thus a transfer stage group is formed by stacking up the transfer stages in layers. The transfer arm D is movable in horizontal directions and vertical directions to transfer the wafer W to and to receive the wafer W from each of the transfer stages TRS1 to TRS5. The respective transfer stages TRS1 and the transfer stages TRS2 of the first unit block B1 and the second unit block B2 transfer the wafer W to and receive the wafer W from the transfer arm C. The transfer stages TRS1 and TRS2 correspond to transfer stages for the carrier handling block S1.

The second unit block B2 is provided with two transfer stages TRS-F. The transfer stages TRS-F are used only for transferring the wafer W to the processing block S2 by the transfer arm C. The transfer stages TRS-F correspond to transfer stages for the carrier handing block S1 and may be placed in the first unit block B1. The transfer stages TRS-F may be omitted and the transfer stage TRS1 and TRS2 may be used for transferring the wafer W from the transfer arm C to the processing block S2.

Figure 6:
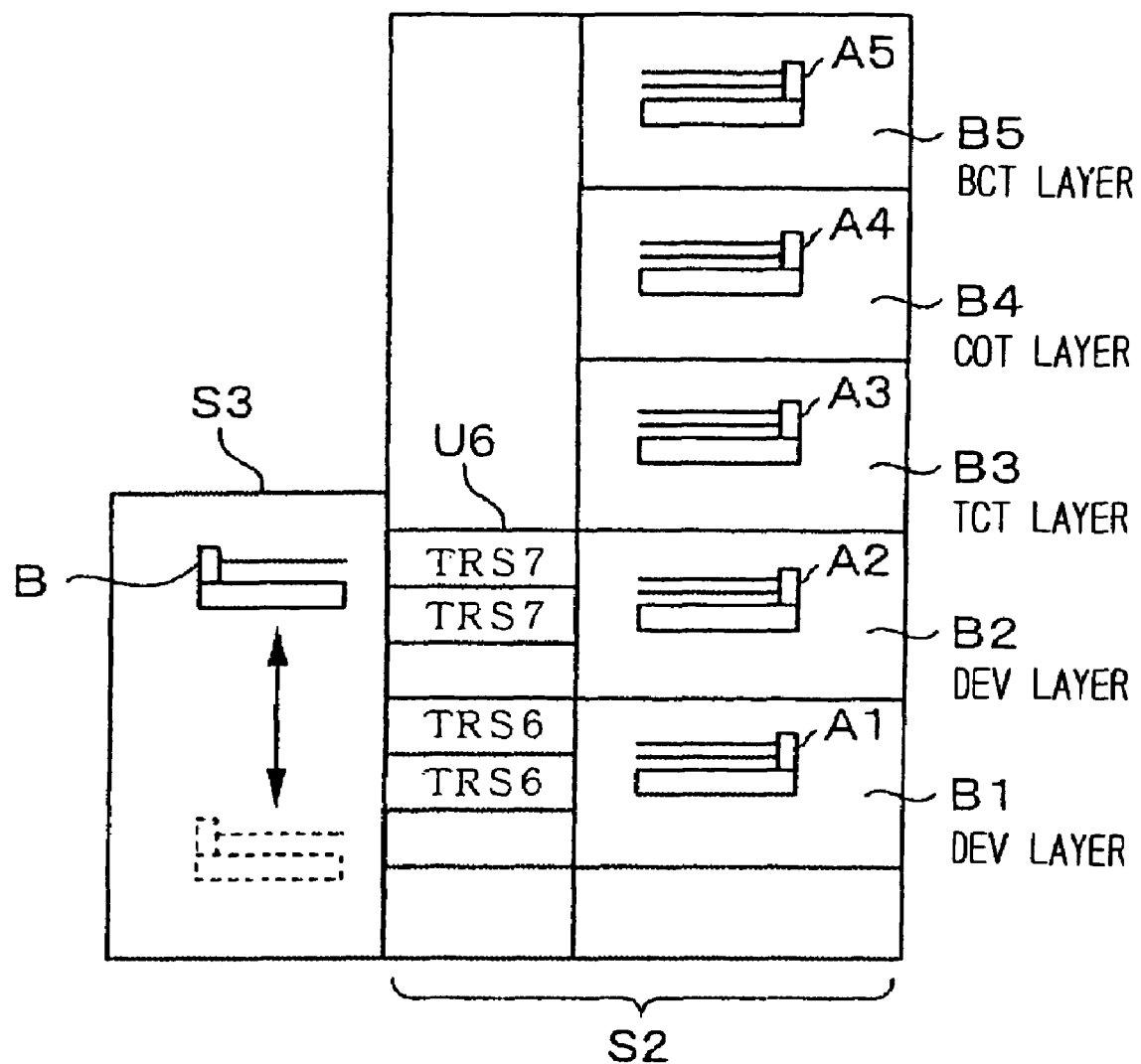
FIG. 6 is a sectional side elevation of an interface block included in the coating and developing system shown in FIG. 1.

Referring to FIGS. 1 and 3, the shelf unit U6 is disposed in a local area, contiguous with the interface block S3, of the carrying area R1 such that the main arms A1 and A2 of the DEV layers B1 and B2 are able to gain access to the shelf unit U6. As shown in FIGS. 3 and 6, the shelf unit U6 has two second transfer stages TRS6 and two second transfer stages TRS7 respectively for the unit blocks B1 and B2 to transfer the wafer W from the shelf unit U6 to each of the main arms A1 and A2 of the unit blocks B1 and B2 and to transfer the wafer W reversely.

The other unit blocks B will be briefly described. The DEV layer B2 is similar in constitution to the DEV layer B1. The DEV layer B2 is similar in construction to the DEV layer B1. The DEV layer B2 is provided with a developing unit 31, heating units PEB2 and POST2 and cooling units COL2. The main arm A2 carries the wafer W from one to another of the transfer stages TRS7 of the shelf unit U5, the developing unit 31 and the processing units of the shelf units U1 to U4.

Figure 7:
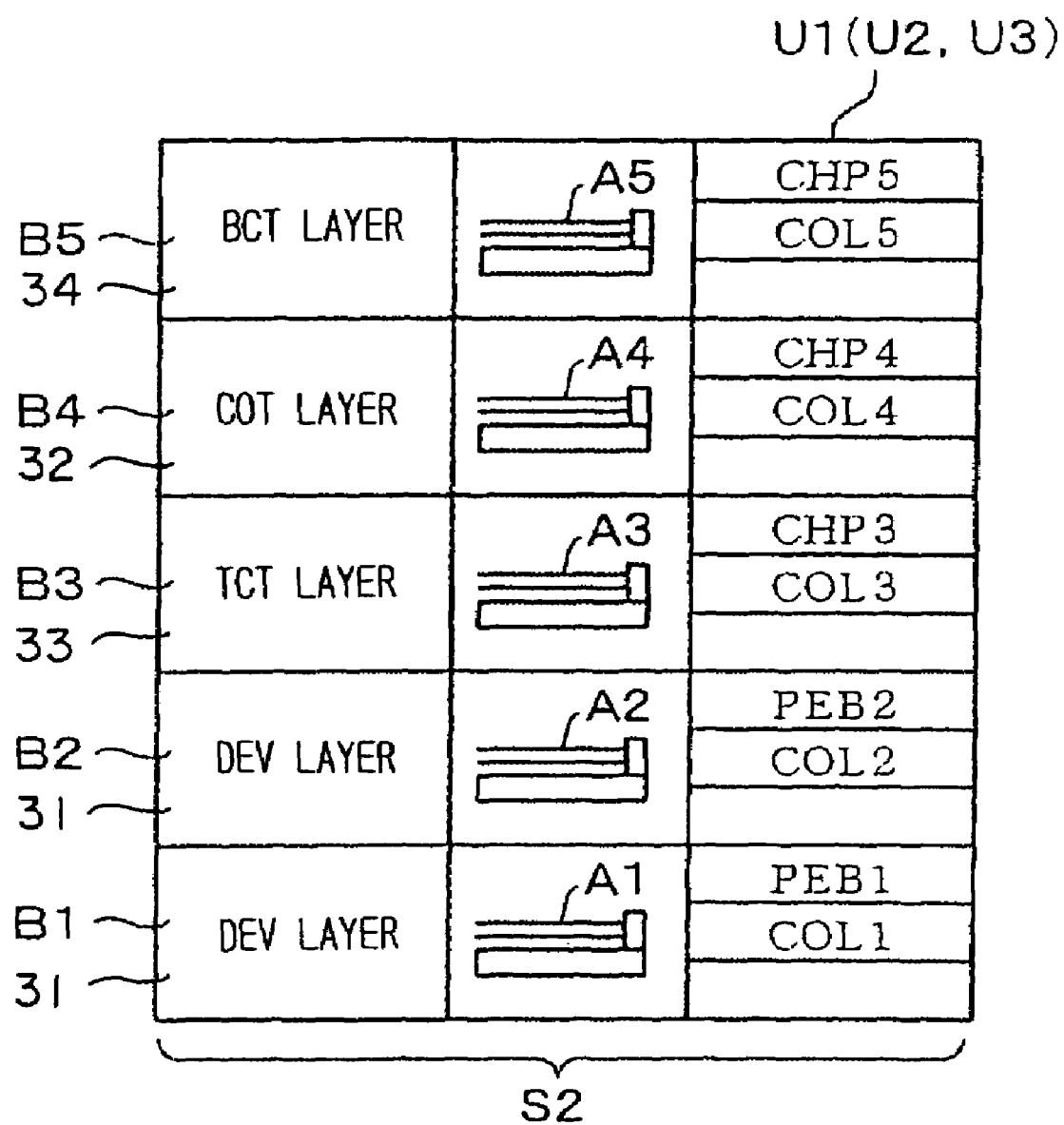
FIG. 7 is a sectional side elevation of unit blocks included in the coating and developing system shown in FIG. 1.
Figure 8:
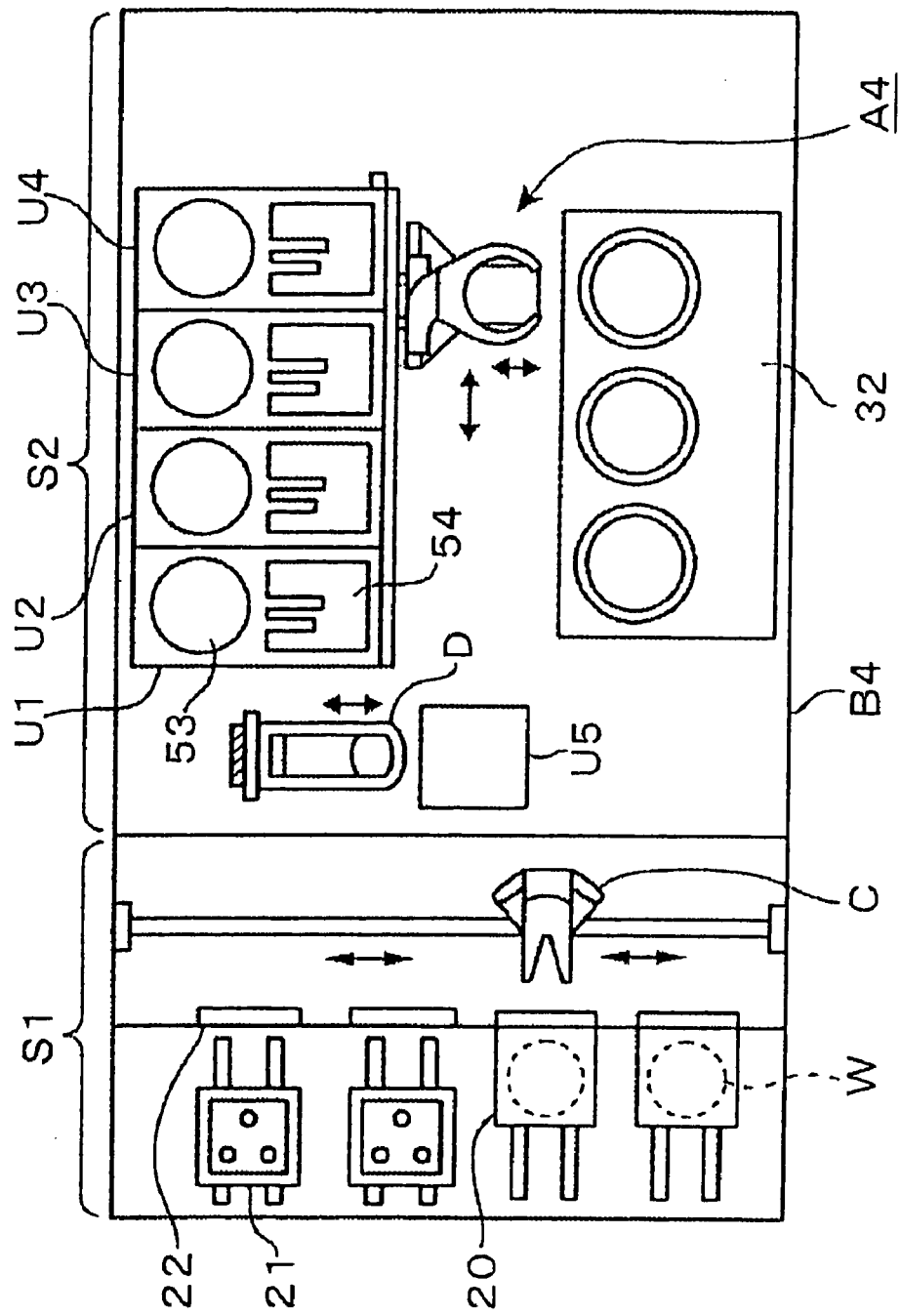
FIG. 8 is a plan view of a fourth unit block included in the coating and developing system shown in FIG. 1.

The film forming unit blocks B3 to B5 are similar in construction and are similar to the developing unit blocks B1 and B2, except that the film forming unit blocks B3 to B5 are not provided with any carrying area connecting the carrier handling block S1 and the interface block S2. The COT layer B4 will be briefly described by way of example with reference to FIGS. 5, 7 and 8. The COT layer B4 is provided with a coating unit 32, namely, a liquid-processing unit, for applying a liquid resist to the wafer W. The shelf units U1 to U4 of the COT layer B4 have cooling units COL4 for processing the wafer W by a cooling process to adjust the temperature of the wafer W to a predetermined temperature before applying a liquid resist to the wafer W, heating units CHP4 for processing the wafer W by a heating process after a liquid resist has been applied to the wafer W, a hydrophobicity imparting unit ADH and a wafer edge exposure device WEE. The COT layer B4 is similar in constitution to the DEV layers B1 and B2, except that the COT layer B4 is not provided with any unit corresponding to the shelf unit U6. In the COT layer B4, the main arm A4 carries the wafer from one to another of the transfer stages TRS4 of the shelf unit U5, the coating unit 32 and the processing units of the shelf units U1 to U4. The hydrophobicity imparting unit ADH processes the wafer W in a gaseous atmosphere of HMDS.

The hydrophobicity imparting unit ADH may be placed in any one of the film forming unit blocks B3 to B5.

The TCT layer B3 is similar in constitution to the COT layer B4 and is provided with a first antireflection forming unit 33 for carrying out a first antireflection film forming process. The TCT layer B3 is similar in constitution to the COT layer B4, except that the TCT layer B3 has shelf units U1 to U4 including cooling units COL3 for adjusting the temperature of the wafer W to a predetermined temperature before the wafer W is subjected to an antireflection film forming process and heating units CHP3 for processing the wafer W processed by the antireflection film forming process by a heating process. In the TCT layer B3, the main arm A3 carries the wafer W from one to another of the transfer stages TRS3 of the shelf unit U5, the first antireflection film forming unit 33 and the processing units of the shelf units U1 to U4.

The BCT layer B5 is provided with a second antireflection film forming unit 34 for processing the wafer W by a second antireflection film forming process. The BCT layer B5 is similar to the COT layer B4, except that the shelf units U1 to U4 are provided with cooling units COL5 for cooling the wafer W at a predetermined temperature before the wafer W is subjected to the antireflection forming process and heating units CHP5 for heating the wafer W after processing the wafer W by the antireflection film forming process, and are not provided with any wafer edge exposure device WEE. The main arm A5 of the fifth unit block B5 carries the wafer W from one to another of the transfer stages TRS5 of the shelf unit U5, the second antireflection film forming unit 34 and the processing units of the shelf units U1 to U4.

As shown in FIG. 1, each of the heating units CHP3 to CHP5, POST1, POST2, PEB1 and PEB2 is provided with a heating plate 53 and a cooling plate 54 serving also as a carrying arm. The cooling plate 54 carries the wafer W between the main arm A1 and the heating plate 53. Thus a single unit heats and cools the wafer W. Each of the cooling unit COL1 to COL5 is provided, for example, with a water-cooled cooling plate.

FIG. 5 shows the layout of those processing units by way of example. The processing units are not limited to the heating units CHP, PEB and POST, the cooling units COL, the hydrophobicity imparting unit ADH and the wafer edge exposure device WEE and may include processing units other than those processing units. The number of the processing units is dependent on processing times required by the processing units.

An exposure system S4 is connected to the shelf unit U6 of the processing block S2 by the interface block S3. The interface block S3 is provided with an interface arm B for carrying the wafer W between each of the shelf units U6 of the DEV layers B1 and B2 of the processing block S2 and the exposure system S4. The interface arm B is a carrying means for carrying the wafer W interposed between the processing block S2 and the exposure system S4. In this embodiment, the interface arm B is able to move in horizontal directions and vertical directions and is able to turn about a vertical axis to carry the wafer W to each of the transfer stages TRS6 and TRS7 of the DEV layers B1 and B2. In this embodiment, the transfer stages TRS6 and TRS7 are stages related with the interface block S3.

The transfer arm D carries the wafer W to and receives the wafer from each of the unit blocks B1 to B5 stacked up in five layers through each of transfer stages TRS1 to TRS5 and TRS-F. The interface arm B carries the wafer W through each of the developing unit blocks B1 and B2 between the processing block S2 and the exposure system S4.

The main arms A (A1 to A5), the transfer arm D, the interface arm B and the liquid-processing units will be briefly explained. As shown in FIG. 4 by way of example, the main arm A is provided with two support arms 101 and 102 on which a peripheral part of the wafer W is seated. The support arms 101 and 102 are able to move individually along a base 103. The base 103 can be turned about a vertical axis by a rotating mechanism 104, can be horizontally moved in directions parallel to the Y-axis along a Y-axis rail 107 attached to a surface, facing the carrying area R1, of a table 106 supporting the shelf units U1 to U4, and can be vertically moved along a vertical rail 108. Thus the support arms 101 and 102 can be moved forward, backward, longitudinally parallel to the Y-axis and vertically and can be turned about a vertical axis. The support arms 101 and 102 can transfer the wafer W to and can receive the wafer W from each of the component units of the shelf units U1 to U6, each of the transfer stages TRS1 to TRS7 and TRS-F and the liquid-processing units. The operation of the main arm A is controlled by a controller on the basis of instructions provided by a control unit 6. Order of the respective operations for receiving the wafer W of the support arms 101 and 102 can be optionally controlled by a program to prevent the support arms 101 and 102 from being heated at the heating units.

Figure 9:
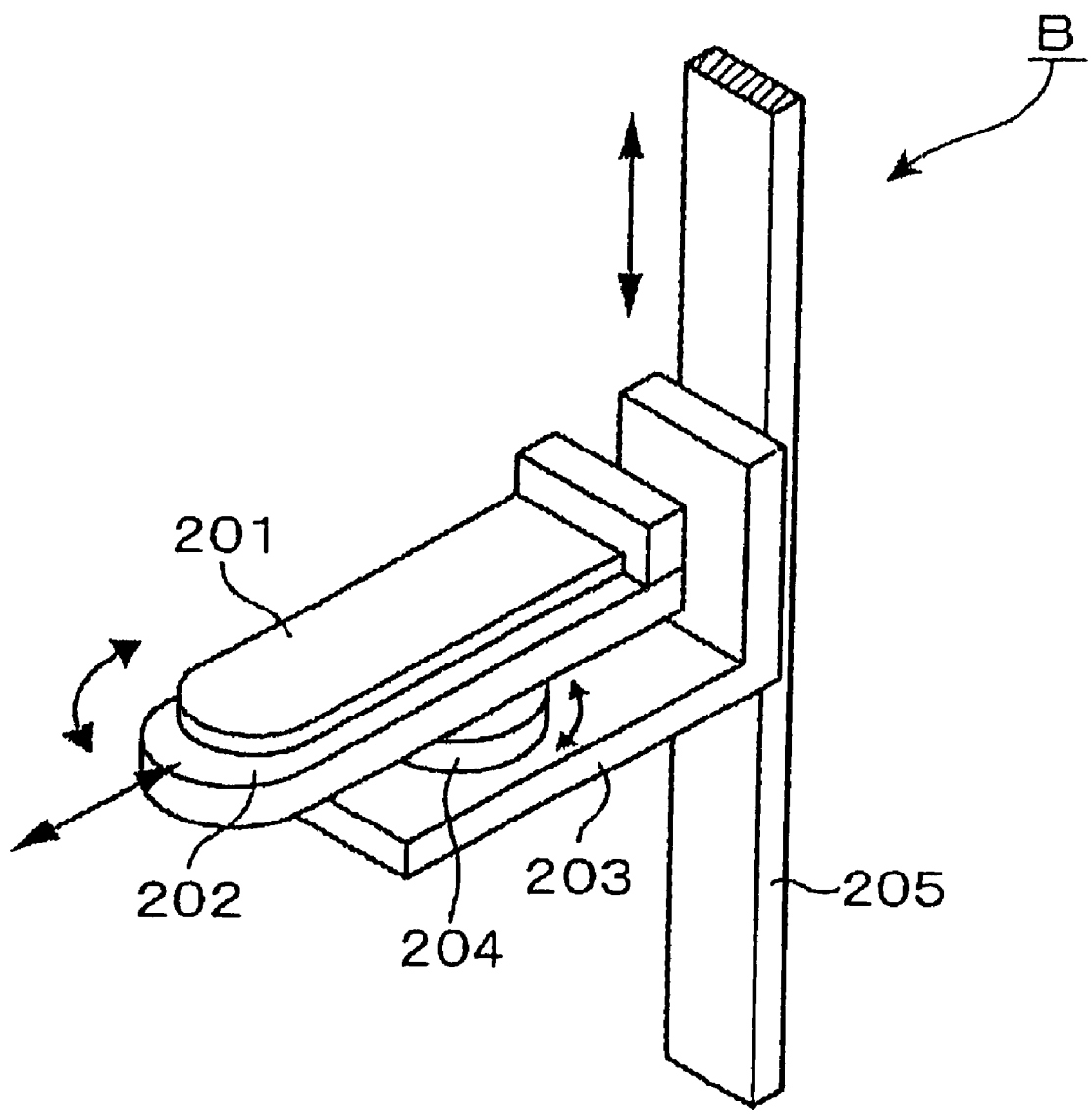
FIG. 9 is a perspective view of an interface arm included in the coating and developing system shown in FIG. 1.

As shown in FIG. 9 by way of example, the interface arm B is provided with a base 202, a support arm 201 on which a central part of the wafer W is seated. The support arm 201 is able to move forward and backward on the base 202. The base 202 is supported on a lifting arm 203 by a rotating mechanism 204 for turning the base 202 about a vertical axis. The lifting arm 203 moves vertically along a vertical rail 205. Thus the arm 201 can be moved forward, backward and vertically and can be turned about a vertical axis to carry the wafer W to and to receive the wafer W from each of the transfer stages TRS6 and TRS7 of the shelf unit U6.

The transfer arm D is similar in construction to the interface arm B, except that the transfer arm D is not turnable about a vertical axis. The respective operations of the transfer arm D and the interface arm B are controlled by a controller, not shown on the basis of instructions provided by the control unit 6.

Figure 10:
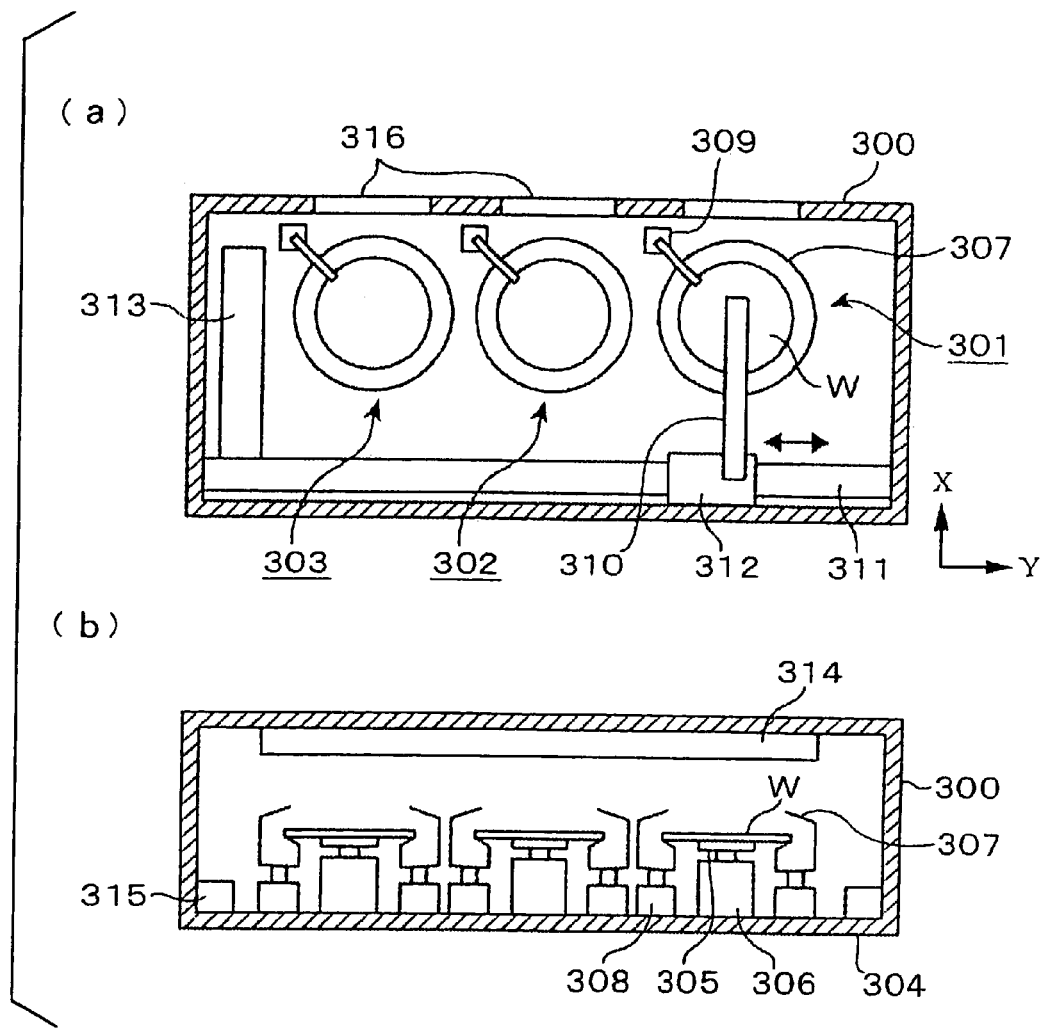
FIGS. 10($a$) and 10($b$) are a plan view and a longitudinal sectional view, respectively, of a coating unit included in the coating and developing system shown in FIG. 1.

The coating unit 32, namely, the liquid-processing unit, will be briefly described in connection with FIG. 10. The coating unit 32 is provided with three coating devices 301, 302 and 303 placed in a processing vessel 300. The processing devices 301 to 303 are arranged on a base 304 along the Y-axis so as to face the carrying area R1.

The coating devices 301 to 303 are similar in construction and hence only the coating device 301 will be described by way of example. The coating device 301 is provided with a spin chuck 305, namely, a substrate holding device, capable of holding the wafer W by suction in a horizontal position. The spin chuck 305 can be rotated about a vertical axis by a driving device 306 and can be vertically moved. The spin chuck 305 and the wafer W supported on the spin chuck 305 are surrounded by a cup 307. A drain device 308 provided with a discharge pipe and a drain pipe is connected to the bottom of the cup 307. A side rinsing mechanism 309 pours a rinsing liquid onto a peripheral part of the wafer W supported on the spin chuck 305. The rinsing mechanism 309 can be moved vertically and can be turned about a vertical axis.

A common chemical liquid supply nozzle 310 for supplying a chemical solution to the coating devices 301 to 303 can be longitudinally moved along a guide rail 311 extended parallel to the Y-axis between a position on the outer side of the cup 307 of the coating device 301 and a position on the outer side of the cup 307 of the coating device 303, and can be vertically moved by a moving mechanism 312. In this embodiment, the chemical solution supply nozzle 310 pours a liquid resist onto a substantially central part of the wafer W supported on the spin chuck 305 of each of the coating devices 301 to 303. Normally, the chemical solution supply nozzle 310 is held in a home area 313 on the outer side of the coating device 303. The chemical solution supply nozzle 310 is operated for dummy dispensing and is cleaned in the home area 313.

A filter unit 314 is attached to the top wall of the processing vessel 300. A discharge unit 315 is disposed on the bottom wall of the processing vessel 300. A gas in the processing vessel 300 is discharged at a predetermined discharge rate by the discharge unit 315, and a clean gas of a predetermined temperature and a predetermined humidity is supplied through the filter unit 314 into the processing vessel 300 in a down flow to maintain the interior of the processing vessel 300 at a positive pressure higher than the pressure in the carrying area R1 in which the main arm A4 operates. Gates 316 through which the wafer W is carried into and carried out of the processing vessel 300 are formed in a wall, facing the carrying area R1, of the processing vessel 300. The gates 316 are covered with shutters, respectively.

In the coating unit 32, the main arm A4 carries the wafer W through the gate 316 into the processing vessel 300 and places the wafer W on the spin chuck 305 of the desired one of the coating devices 301 to 303. Then, the chemical liquid supply nozzle 310 pours a liquid resist onto a central part of the wafer W, the spin chuck 305 rotates to spread the liquid resist radially outward over the surface of the wafer W by centrifugal force to coat the surface of the wafer W with a liquid resist film. Then, the main arm A4 caries out the wafer W coated with the liquid resist film from the coating unit 32.

The three coating devices 301 to 303 of the coating unit 32 are placed in the same processing atmosphere in the processing vessel 300. Therefore, the chemical liquid supply nozzle 310 can be used as a single common nozzle for supplying the liquid resist to all the coating devices 301 to 303. Thus the coating unit 32, as compared with a coating unit provided with processing vessels 300 and chemical liquid supply nozzles 310 respectively for coating devices 301 to 303, has the less number of parts and needs less floor space.

Since the processing devices 301 to 303 are placed in the same processing atmosphere in the processing vessel 300, a single air supply system for producing down flow of air in the processing vessel 300 and a single air discharge system for discharging air from the processing vessel 300 can be used for all the coating devices 301 to 303, which is effective in reducing component members and necessary floor space. Since the coating devices 301 to 303 are disposed in the same atmosphere, the coating devices 301 to 303 are able to carry out the coating process for coating the wafer with the liquid resist film in the same atmosphere, the coating process susceptible to the processing atmosphere can be carried out in the same mode by all the coating devices 301 to 303.

Since the three coating devices 301 to 303 are mounted on the common base 304, the height adjustment of the support arms 101 and 102 of the main arm A4 relative to the spin chucks 305 can be achieved by adjusting the respective vertical positions of the support arms 101 and 102 relative to the spin chuck of only one of the coating devices 301 to 303. Since the chemical liquid supply nozzle 310 is used for supplying the liquid resist to each of the coating devices 301 to 303, the vertical position of the chemical liquid supply nozzle 310 needs to be adjusted relative to the spin chuck 305 of only one of the coating devices 301 to 303. Thus time and work necessary for adjusting the vertical position of the support arms 101 and 102 of the main arm A4 and the chemical liquid supply nozzle 310 can be reduced.

The developing unit 31 is substantially similar to the coating unit 32, except that the developing unit 31 has a developer supply area extending along the length of a supply nozzle 310 to pour a developer in a direction parallel to the diameter of the wafer W, and is provided with a cleaning liquid pouring nozzle. The cleaning liquid pouring nozzle is similar to the supply nozzle 310 and can be moved along the guide rail 311 and vertically by a moving mechanism. The cleaning nozzle pours a cleaning liquid onto the wafer W held on each of the spin chucks 305 of coating devices, namely, developing devices, 301 to 303.

In the developing unit 31, the main arms A1 and A2 carry the wafer W through a gate 316 into a processing vessel 300 and places the wafer W on the spin chuck 305 of desired one of the coating devices (developing devices) 301 to 303. Then, the supply nozzle 310 pours a developer onto a central part of the wafer W and the spin chuck 305 supporting the wafer W makes half a turn to pour the developer over the entire surface of the wafer W. After a predetermined time has passed, the cleaning liquid supply nozzle pours a cleaning liquid onto the wafer W to wash away the developer from the wafer W. Then, the wafer W is rotated to dry the wafer W to complete the developing process.

The developing unit 31 may be provided, instead of the cleaning liquid supply nozzle, with a cleaning mechanism which can be moved vertically and can be turned about a vertical axis similarly to the side rinsing mechanism 309 to pour a cleaning liquid onto a central part of the wafer W held on the spin chuck 302.

The first antireflection film forming unit 33 applies a chemical liquid for forming an antireflection film to the surface of the wafer W after the liquid resist is applied to the wafer W. The second antireflection film forming unit 34 applies a chemical liquid for forming an antireflection film to the wafer W before the liquid resist is applied to the wafer W. The antireflection film forming units 33 and 34 are the same in construction as the coating unit 31, except that the antireflection film forming units 33 and 34 apply the chemical liquids for forming the antireflection films, respectively, to the wafer W.

The flow of the wafer W in the resist pattern forming system will be described on an assumption that the resist film is sandwiched between the antireflection films. The carrier 20 is delivered to the carrier handling block S1. The transfer arm C takes out the wafer W from the carrier 20 and transfers the wafer W to the transfer stage TRS-F of the DEV layer B2. The transfer arm D carries the wafer W from the transfer stage TRS-F to transfer stage TRS5 of the shelf unit U5 to transfer the wafer to the BCT layer B5. The main arm A5 of the BCT layer B5 receives the wafer W from the transfer stage TRS5.

Then, in the BCT layer B5, the main arm A5 carries the wafer W sequentially to the cooling unit COL5, the second antireflection film forming unit 34, the heating unit CHP5 and the transfer stage TRS5 of the shelf unit U5 in that order to form the second antireflection film on the wafer w.

Subsequently, transfer arm D carries the wafer W from the transfer stage TRS5 to the transfer stage TRS4 to transfer the wafer W to the COT layer B4. Then, the main arm A4 of the COT layer B4 carries the wafer W sequentially to the hydrophobicity imparting unit ADH, the cooling unit COL4, the coating unit 32, the heating unit CHP4 and the transfer stage TRS4 of the shelf unit US in that order to form the resist film over the second antireflection film.

Then, the transfer arm D carries the wafer W from the transfer stage TRS4 to the transfer stage TRS3 of the TCT layer B3. Then, the main arm A3 of the TCT layer B3 carries the wafer W sequentially to the cooling unit COL3, the first antireflection film forming unit 33, the heating unit CHP3, the wafer edge exposure device WEE and the transfer stage TRS3 of the shelf unit US in that order to form the first antireflection film on the resist film.

Subsequently, the interface arm D carries the wafer W from the transfer stage TRS1 (or TRS2) of the shelf unit U5. Then, the main arm A1 (or A2) of the DEV layer B1 (or DEV layer B2) carries the wafer W to the transfer stage TRS6 (or TRS7) of the shelf unit U6. Then, the interface arm B carries the wafer W from the transfer stage TRS6 (or TRS7) to the exposure system S4 to subject the wafer W to a predetermined exposure process.

After the exposure process has been completed, the interface arm B carries the wafer W to the transfer stage TRS6 (or TRS7) of the shelf unit U6 to deliver the wafer W to the DEV layer B1 (DEV layer B2). Then, the main arm A1 of the DEV layer B1 (or the main arm A2 of the DEV layer B2) carries the wafer W from the transfer stage TRS6 (TRS7) to the heating unit PEB1 (PEB2), the cooling unit COL1 (COL2), the developing unit 31, the heating unit POST1 (POST2) of the DEV layer B1 (DEV layer B2) to process the wafer W by a predetermined developing process. After the developing process has been completed, the wafer W is delivered to the transfer stage TRS1 (TRS2) of the shelf unit U5. Then, the transfer arm C carries the wafer W to return the wafer W to the carrier 20 placed on the carrier support table 21 of the carrier handling block S1.

The coating and developing system is provided with the control unit 6 including a computer for managing recipes for the operations of the processing units, managing carrying recipes for carrying the wafer W along carrying routes and controlling the processing operations of the processing units and the operations of the main arms A1 to A5, the transfer arm C, the transfer arm D and the interface arm B. The control unit 6 controls the unit blocks B1 to B5 to carry and process the wafer W.

The carrying recipe for the flow of the wafer W specifies a carrying route along which the wafer W is carried in the unit block. Carrying recipes are produced exclusively for the unit blocks B1 to B5 according to the types of films formed in the unit blocks B1 to B5. The carrying recipes for the unit blocks B1 to B5 are stored in the control unit 6.

The wafer W is carried in one of a plurality of carrying modes specific to the types of films. There are a carrying mode of carrying the wafer W to all the unit blocks B1 to B5, a carrying mode of carrying the wafer W to the unit blocks (DEV layer B1, DEV layer B2) which carry out the developing process, the unit block (COT layer B4) which carries out the liquid resist application process and the unit block (BCT layer B5) which carries out the second antireflection film forming process, a carrying mode of carrying the wafer to the unit block (DEV layer B1, DEV layer B2) which carries out the developing process, the unit block (COT layer B4) which carries out a liquid resist application process, and a unit block (TCT layer B3) which carries out the first antireflection film forming process, and a carrying mode of carrying the wafer W only to the unit block (DEV layer B1, DEV layer B2) which carries out the developing process. A mode selector included in the control unit 6 selects the unit blocks to which the wafer W is to be carried on the basis of the type of a film to be formed and selects the optimum ones of the plurality of carrying recipes prepared for the selected unit blocks. Thus the proper unit blocks for forming the specified film are selected, the arms and the processing units of the unit blocks are controlled to carry out a series of processes.

In this coating and developing system, the unit blocks respectively for forming different types of films, and the unit blocks for carrying out the developing process are disposed in separate areas, respectively, and those unit blocks are provided individually with the main arms A. Therefore the load on each of the main arms A is small, the carrying efficiency of the main arms A is improved and, consequently, the throughput of the coating and developing system can be increased.

The unit block (COT layer B4) exclusively for forming the resist film, the unit block (TCT layer B3) exclusively for forming the first antireflection film and the unit block (BCT layer B5) exclusively for forming the second antireflection film are stacked in layers. Therefore, a floor space in the processing block S2 needed for forming the two antireflection films over and under the resist film is equal to that needed in the processing block S2 for forming only the resist film. Consequently, space in which the coating and developing system is installed can be reduced.

Since the COT layer B4, the TCT layer B3 and the BCT layer B5 are individual unit blocks for forming the film, it is possible to cope with a case where the antireflection film is to be formed and a case where any antireflection film is not formed by selecting the necessary unit blocks from the DEV layers B1 and B2 (or either of the DEV layer B1 and the DEV layer B2), the TCT layer B3, the COT layer B4 and the BCT layer B5. Since the unit blocks to be used have the same carrying routes, respectively, the carrying programs are not complicated, the carrying operation for carrying the wafer W can be controlled by a simple carrying program and the software is simplified when different films of different lots are formed by the one and the same coating and developing system.

As mentioned above, the unit blocks to be used for processing the wafer W among the unit blocks B1 to B5 are determined by selecting the unit blocks and the carrying recipes for a desired film from the unit blocks for forming films stored in the control unit 6 and the carrying recipes for the unit blocks.

For example, when any antireflection film is not formed, only the DEV layer B1 (B2) and the COT layer B4 are selected, and the wafer is carried from the carrier 20, along a carrying route sequentially passing the transfer arm C, the transfer stage TRS-F of the shelf unit U5, the transfer arm D, the transfer stage TRS4, the main arm A4 of the COT layer B4, the hydrophobicity imparting unit ADH, the cooling unit COL4, the coating unit 32, the heating unit CHP4, the wafer edge exposure device WEE, the transfer stage TRS4 of the shelf unit U5, the transfer arm D, the transfer stage TRS1 (TRS2) of the shelf unit U5, the main arm A1 of the developing layer B1 (the main arm A2 of the DEV layer B2), the transfer stage TRS6 (TRS7) of the shelf unit U6, the interface arm B, the exposure system S4, the interface arm B, the transfer stage TRS6 (TRS7) of the shelf unit U6 and the DEV layer B1 (B2) in that order.

When only the resist film and the antireflection film underlying the resist film are to be formed, only the DEV layer B1 (B2), the BCT layer B5 and the COT layer B4 are selected, and, for example, the wafer W is carried from the carrier 20 along a carrying route sequentially passing the transfer arm C, the transfer stage TRS-F of the shelf unit U5, the transfer arm D, the first transfer stage TRS5, the transfer arm D, the transfer state TRS5 of the shelf unit U5, the main arm A5 of the BCT layer B5, the cooling unit COL5, the second antireflection film forming unit 34, the heating unit CHP5, the transfer stage TRS5, the transfer arm D, the transfer stage TRS4, the main arm A4 of the COT layer B4, the hydrophobicity imparting unit ADH, the cooling unit COL4, the coating unit 32, the heating unit CHP4, the wafer edge exposure device WEE, the transfer stage TRS4 of the shelf unit U5, the transfer arm D, the transfer stage TRS1 (TRS2) of the shelf unit U5, the main arm A1 of the DEV layer B1 (the main arm A2 of the DEV layer B2), the transfer stage TRS6 (TRS7) of the shelf unit U6, the interface arm B, the exposure system S4, the interface arm B, the transfer stage TRS6 (TRS7) of the shelf unit U6 and the DEV layer B1 (B2) in that order.

When only the resist film and the antireflection film overlying the resist film are to be formed, only the DEV layer B1 (B2), the COT layer B4 and the TCT layer B3 are selected, and, for example, the wafer W is carried from the carrier 20 along a carrying route sequentially passing the transfer arm C, the transfer stage TRS-F of the shelf unit U5, the transfer arm D, the transfer stage TRS4 of the shelf unit U5, the main arm A4 of the COT layer B4, the hydrophobicity imparting unit ADH, the cooling unit COL4, the coating unit 32, the heating unit CHP4, the transfer stage TRS4 of the shelf unit U5, the transfer arm D, the transfer stage TRS3 of the shelf unit U5, the main arm A3 of the TCT layer B3, the cooling unit COL3, the first antireflection film forming unit 33, the heating unit CHP3, the wafer edge exposure device WEE, the transfer stage TRS3 of the shelf unit U5, the transfer arm D, the transfer stage TRS1 (TRS2) of the shelf unit U5, the main arm A1 of the DEV layer B1 (the main arm A2 of the DEV layer B2), the transfer stage TRS6 (TRS7) of the shelf unit U6, the interface arm B, the exposure system S4, the interface arm B, the transfer stage TRS6 (TRS7) of the shelf unit U6 and the DEV layer B1 (B2) in that order.

The carrying routes respectively in the selected unit blocks (the COT layer B4, the BCT layer B5 and the TCT layer B3) for forming the films are the same. Therefore, when different films are to be formed, it is necessary only to select the proper unit blocks to be used and to carry the wafer W to the selected unit blocks. Therefore, the carrying program is simple.

In this embodiment, the carrying areas R1, in which the wafer W is carried, extending between the carrier handling block S1 and the interface block S3 are formed only in the developing unit blocks B1 and B2, and the transfer arm D is used exclusively for carrying the wafer W from each of the film forming unit blocks B3 to B5 to each of the developing unit blocks B1 and B2 and to carry the wafer W reversely. Thus, the wafer W processed by the film forming process is carried through each of the developing unit blocks B1 and B2 to the interface block S3 and hence the carrying system is simplified.

Since only the transfer stages TRS6 and TRS7 of the shelf unit U6 are used for transferring the wafer W from the processing block S2 to the interface block S3 and for reversely transferring the wafer, the interface arm B needs to operate in a narrow moving range, which facilitates the control of the carrying operation of the interface arm B. Since the carrying system and the access to the devices are simple, the carrying system can be easily controlled.

Since the film forming unit blocks are similar in constitution and differ from each other only in the types of the chemical liquids used by the liquid-processing units, chemical liquid supply lines, drain lines and discharge lines can be collectively laid, cables of electric systems can be collectively laid, pipes and cables can be simply arranged and hence the coating and developing system can be easily assembled. Consequently, manufacturing time can be reduced, the throughput of the manufacturing line can be increased and the manufacturing costs can be reduced.

When the BCT layer B5, the COT layer B4 and the TCT layer B3 are formed of the similar unit blocks, namely, the similar liquid-processing units, the heating units and the cooling units, and provided with the main arms of the same layout and differ from each other only in the types of chemical liquids used by the liquid-processing units, the coating and developing system can be built by assembling unit blocks of the same design. The manufacture of the coating and developing system including the unit blocks of the same design, as compared with a coating and developing system including unit blocks of different designs, facilitates manufacturing work, reduces faulty manufacturing work, increases the throughput of a coating and developing system manufacturing line and reduces the manufacturing costs of the coating and developing system. Use of many common parts for building the coating and developing system is effective in reducing manufacturing costs. When the BCT layer B5, the COT layer B4 and the TCT layer B3 are built by assembling the same unit blocks, faulty manufacturing work can be reduced, accuracy increases and adjustment is facilitated, and time necessary for adjustment can be reduced.

Even if any one of the film forming unit blocks becomes inoperative due to accidental troubles, another film forming unit block can be used to form a film.

Figure 11:
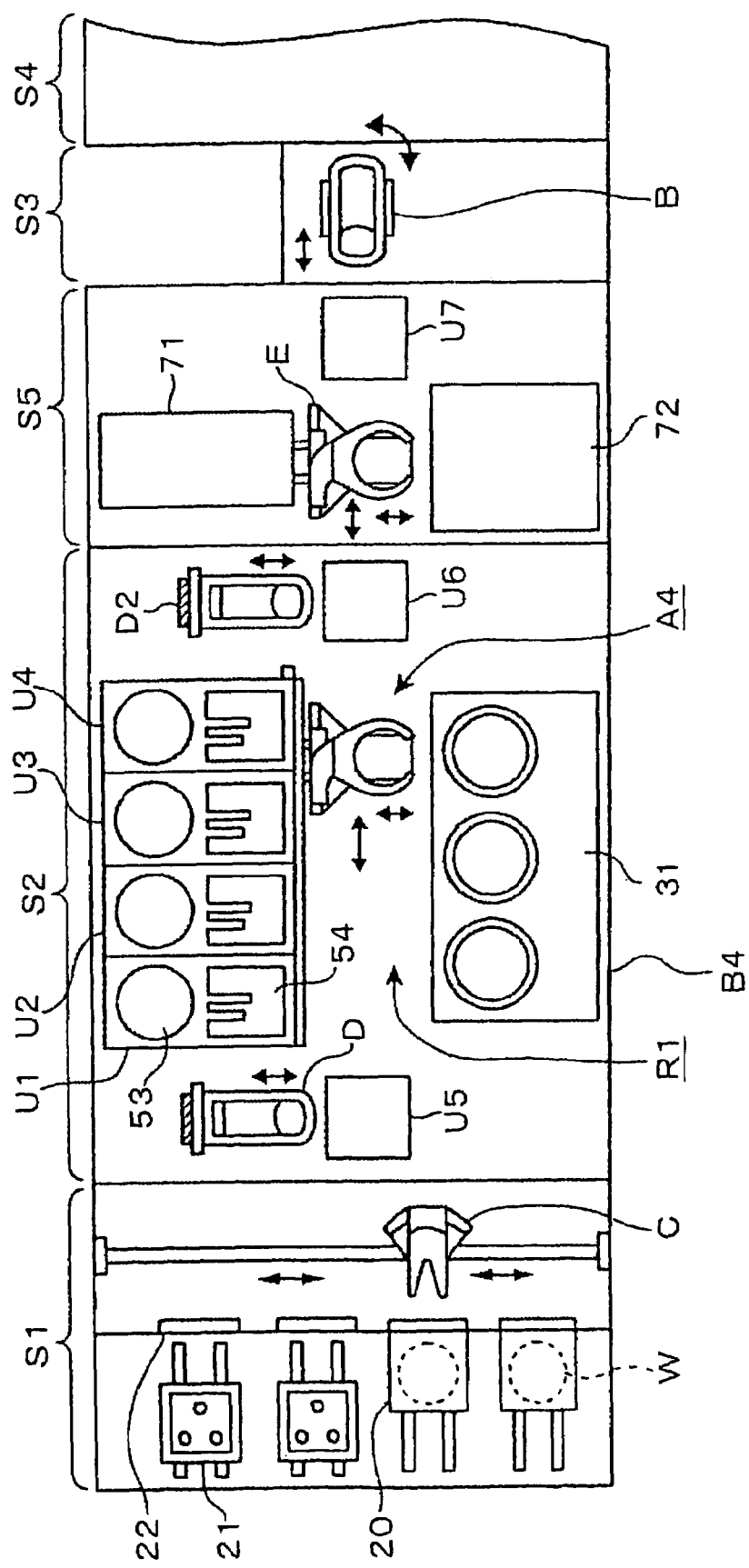
FIG. 11 is a plan view of a coating and developing system in a second embodiment according to the present invention.
Figure 12:
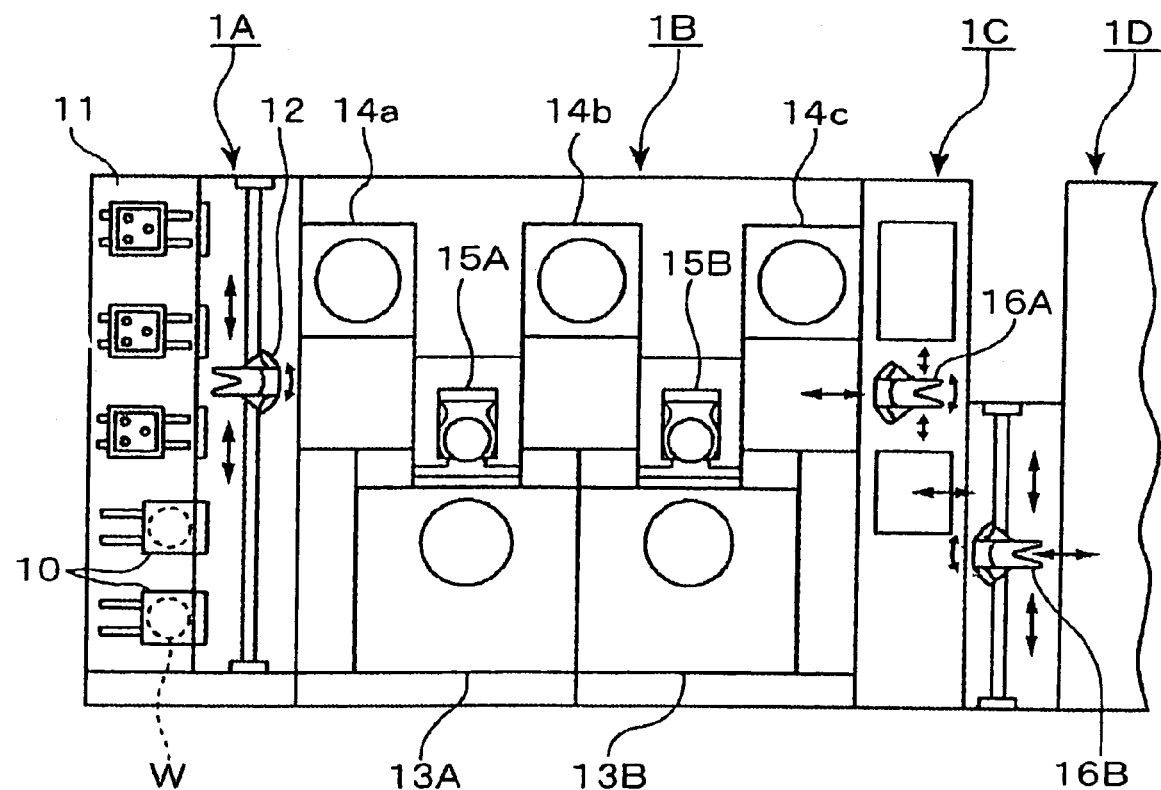
FIG. 12 is a plan view of a prior art coating and developing system.

A coating and developing system in a second embodiment according to the present invention will be described with reference to FIG. 11. This coating and developing system is combined with an exposure system S4 which carries out an immersion exposure process which forms a liquid layer on a surface of the wafer W, includes an auxiliary block S5 interposed between a processing block S2 and an interface block S3, and is provided additionally with a film forming unit block, not shown, including a water-repellent protective film forming unit, for forming a water-repellent protective film on a second antireflection film or a resist film, disposed, for example, on a BCT layer B5. The water-repellent protective film forming unit is a liquid-processing unit to deal with immersion exposure. The water-repellent protective film forming unit forms a protective film capable of preventing a resist film from being impregnated with a liquid for immersion exposure. The unit block including the water-repellent protective film forming unit may be provided with a protective film removing device for removing the protective film after exposure and a cleaning device for removing particles from the wafer W before and after exposure and for removing matters that will affect adversely to exposure.

Installed in the auxiliary block S5 are an inspection unit 71 for inspecting the wafer between a film forming process and an exposure process and between the exposure process and a developing process, a cleaning unit 72 for cleaning the wafer W by a cleaning process after the immersion exposure process, a shelf unit U7 built by stacking up transfer stages TRS from which an interface arm B included in an interface block S3 receives the wafer W and to which the interface arm B delivers the wafer W, a transfer device E for carrying the wafer W from one to another of transfer stages TRS6 and TRS7 included in a shelf unit U6 in a processing block S2, the inspection unit 71, the cleaning unit 72 and parts of a shelf unit U7. The inspection unit 71 and the cleaning units 72 may be layered structures. Only cleaning units 72 or inspection units 71 may be disposed on the opposite sides of the transfer device E. The arrangement of those components is optional.

The transfer device E is capable of moving in horizontal directions and vertical directions and of turning about a vertical axis. The inspection between the film forming process and the exposure process includes measuring the thickness of the film formed on the wafer W and search for foreign matters on the wafer. The inspection between the exposure process and the developing process includes a photomask alignment inspection. The auxiliary block S5 may be provided with an alignment mark detector for detecting an alignment mark formed on a substrate and a film removing unit for removing part of a film by a laser process.

At least one of functional units and devices is installed in the auxiliary block S5. The functional units and devices include a surface inspection unit for inspecting the surface of the wafer W, a film thickness measuring unit for measuring the thickness of a film formed on the wafer W, an irregularity detecting device for detecting irregularities in a liquid resist film, a cleaning unit for cleaning the wafer W before and/or after the developing process, a defocus inspection device for inspecting a pattern for dislocation, a development defects detecting device for detecting defects in the film due to faulty development, a particle counting device for counting particles adhering to the wafer W, a comet detecting device for detecting comets formed in a liquid resist film by bubbles or foreign matters contained in the liquid resist applied to the wafer W, a splash-back detecting device for detecting the solvent of the liquid resist splashed from the liquid resist and adhered to the wafer W, a common defect detecting device for detecting defects of the same shape appearing at the same positions on the surfaces of wafers W, a scum detecting device for detecting residual resist remaining on the wafer W after the developing process, a defective resist film and faulty development detecting device for detecting defects in the resist film and/or for detecting faulty development (defect detecting device), a line width measuring device for measuring the width of the lines of a patterned resist film, and a photomask alignment inspecting device for inspecting the accuracy of alignment of a photomask with the wafer W subjected to the exposure process.

Defocus inspection by the defocus inspection device finds out a defocus condition of the exposure system through the comparison of a pattern formed on the wafer W with a registered correct pattern. For example, the line width measuring device decides whether or not exposure and exposure time in which the exposure system processed the resist film formed on the wafer W are proper through the comparison of a measured pattern with a previously registered correct pattern. For example, the photomask alignment inspecting device decides whether or not exposure and exposure time in which the exposure system processed the resist film formed on the wafer W are proper through the comparison of a pattern of a specific part which can be compared with a pattern of a lower layer with a previously registered correct pattern.

When the wafer W is to be subjected to a cleaning process after exposure, the wafer W is carried sequentially, for example, to a carrier handling block S1, a BCT layer B5, a COT layer B4 and a unit block for forming a water-repellent protective film in that order. Subsequently, the wafer W is carried sequentially, for example, to a transfer stage in the shelf unit U5, a transfer arm D, a transfer stage TRS1 (TRS2) in the shelf unit U5, a main arm A1 included in the DEV layer B1(a main arm A2 included in a DEV layer B2), a transfer stage TRS6 (TRS7) included in a shelf unit U6, the transfer device E in the auxiliary block S5, a transfer stage in a shelf unit U7, an interface arm B in the interface block S3 and the exposure system S4 in that order. The wafer W processed by an exposure process is carried sequentially to the interface arm B in the interface block S3, a transfer stage in the shelf unit U7 of the auxiliary block S5, the transfer device E, the cleaning unit 72, the transfer device E, the transfer stage TRS6 (TRS7) in the shelf unit U6, the main arm A1 (A2) and the DEV layer B1 (B2) in that order.

One out of a predetermined number of wafers W is subjected to predetermined inspections. For example, when the wafer W is to be inspected after forming a film thereon, the wafer W is inspected in the auxiliary block S5 before delivering the wafer W to the exposure system S4. When the wafer W is to be inspected after exposure, the wafer W returned from the exposure system S4 to the auxiliary block S5 is inspected. When the wafer W is to be inspected after the developing process, the wafer processed by the developing process in the processing block S2 is transferred to the auxiliary block S5 for inspection.

The water-repellent protective film is formed on the resist film to repel the liquid by the protective film during immersion exposure and to make the liquid hardly able to stay on the surface of the wafer W. For example, the protective film is formed on the surface of the wafer W and on a peripheral part of the back surface of the wafer W. The wafer W processed by the immersion exposure process is subjected to a cleaning process to remove the protective film in order to avoid producing particles by the protective film fallen off the wafer W. For example, a chemical liquid for removing the protective film is poured on the surface and the peripheral part of the back surface of the wafer W to remove the protective film, and the chemical liquid wetting the wafer W is washed off by a cleaning liquid.

In the second embodiment, the auxiliary block S5 provided with the inspection unit and the cleaning unit is interposed between the processing block S2 and the interface block S3. Therefore, for example, the wafer W can be inspected and cleaned when the wafer W is transferred from the processing block S2 to the interface block S3 before the wafer W is subjected to the exposure process after being processed by the film forming process, and/or the wafer W can be inspected and cleaned after the exposure process before subjecting the wafer W to the developing process. The complexity of the carrying program can be suppressed even if the wafer W is subjected to inspection and cleaning in the foregoing mode. Thus the complication of the route along which the wafer W is carried can be prevented, the wafer W can be inspected and cleaned at the proper time after the film forming process and at the proper time after the exposure process, and the complication of the carrying program can be prevented even if the wafer W is inspected and cleaned. When any protective film is not formed on the wafer, the cleaning unit 72 is used simply for cleaning the wafer W.

The second embodiment may form the protective film on the resist film when any antireflection film is not formed on the wafer W, the wafer W may be subjected to the cleaning process before or after the exposure process or before and after the exposure process.

According to the present invention, the transfer stages for carrying the wafer W from each of the developing unit blocks B1 and B2 to each of the film forming unit blocks B3 to B5 and for carrying the wafer W reversely may be included in the shelf unit U6 instead of in the shelf unit U5, and the transfer arm D may be placed so as to be able to access the devices in the shelf unit U6 instead of the devices in the shelf unit U5. In such a case, the shelf unit U5 is provided with transfer stages via which the wafer W is carried from the carrier handling block S1 to each of the developing unit blocks B1 and B2 and the wafer W is carried reversely, and the shelf unit U6 is provided with transfer stages via which the wafer W is carried from the interface block S3 and each of the developing unit blocks B1 and B2 and the wafer W is carried reversely.

The wafer W carried from the carrier handling block S1 via the transfer stage of the shelf unit U5 to the DEV layer B1 (B2) is carried by the main arm A1 of the DEV layer B1 (the main arm A2 of the DEV layer B2) to the transfer stage of the shelf unit U6, and then the transfer arm D carries the wafer W to a desired one of the film forming unit blocks. The transfer arm D transfers the wafer W from one to another of the film forming unit blocks via the transfer stages of the shelf unit U6. The wafer W provided with a film is carried via the transfer state of the shelf unit U6 to the transfer stage of the shelf unit U6 of the DEV layer B1 (B2). Then, the interface arm B carries the wafer W from the transfer stage of the shelf unit U6 of the DEV layer B1 (B2) to the exposure system S4. After the wafer W has been processed by the exposure process, the interface arm B carries the wafer W via the transfer stage of the shelf unit U6 to the DEV layer B1 (B2).

In the second embodiment, the interface arm B is capable of accessing the transfer stages of the shelf unit U6. The wafer W may be carried before being subjected to the exposure process after the last film has been formed thereon by the film forming unit block to the transfer stage of the shelf unit U6 of the same film forming unit block, and then the interface arm B may carry the wafer W from the transfer stage to the next process.

The second embodiment transfers the wafer W from the carrier handling block S1 to the processing block S2 and transfers the wafer W reversely only via the transfer stage of the DEV layer B1 (B2). Therefore, the range the accessing operation of the transfer arm C of the carrier handling block S1 is narrowed, which facilitates the control of the transfer arm C.

The second embodiment carries the wafer W between the carrier handling block S1 and the interface block S3 only through the developing unit block B1 (B2). The wafer W may be carried between the carrier handling block S1 and the interface block S3 through at least one of the film forming unit blocks B3 to B5.

A constitution in which all the film forming unit blocks B3 to B5 are provided with transfer stages via which the wafer W is carried between the carrier handling block S1 and the interface block S3 and the developing unit blocks B1 and B2 are not provided with any transfer stages will be described by way of example. For example, the unit blocks B1 to B5 are provided with transfer stages in an area contiguous with the carrier handling block S1, and the transfer arm D is able to access the transfer stages. For example, the film forming unit blocks B3 to B5 are provided with transfer stages for the carrier handling block S1 and those for the interface block S3.

In this example, the wafer W is carried from the carrier handling block S1 via the transfer stage of the BCT layer B5 to the unit block B5. The transfer arm D carries the wafer W from the transfer stage along a route passing the COT layer B4 and the TCT layer B3 in that order. Then, the interface arm B carries the wafer W from the transfer stage for the interface block S3 of the TCT layer B3 to the exposure system S4.

The wafer W processed by the exposure system S4 is carried via the transfer stage for the interface block S3 of the unit block B3, B4 or B5 to the unit block B3, B4 or B5. The transfer arm D carries the wafer W from the transfer stage to the developing unit block B1 (B2). The developing unit block B1 (B2) processes the wafer W by the developing process and transfers the wafer W to the transfer stage. Then, the transfer arm D carries the wafer W processed by the developing process from the transfer stage to the stage for the carrier handling block S1 of the film forming unit B3, B4 or B5, and then the wafer W is transferred to the carrier handling block S1.

All the unit blocks B1 to B5 may be provided with the transfer stages for the interface block S3. The transfer stages for the interface block S3 may be formed in at least one of the film forming unit blocks B3 to B5 or may be formed in the different film forming unit blocks.

Since the single transfer arm D carries the wafer W to all the unit blocks B1 to B5, the carrying system is simple. Since the carrier handling block S1 and the interface block S3 are connected only by the film forming unit blocks B3 to B5, the transfer arm C and the interface arm B need to operate in narrow ranges, respectively, and hence the transfer arm C and the interface arm B can be easily controlled.

In this example, the wafer W may be transferred from one to another of all the unit blocks B1 to B5 by using only the transfer stages on the side of the interface block S3 and the transfer arm capable accessing the transfer stages in combination.

In such a case, the film forming unit blocks B3 to B5 are provided with both transfer stages for the carrier handling block S1 and those for the interface block S3, respectively. The wafer W carried from the carrier handling block S1 to the BCT layer B5 is carried by the transfer arm from the transfer to the CT layer B4 and the TCT layer B3 in that order. Then, the interface arm B carries the wafer W from the transfer stage for the interface block S3 of the TCT layer B3 to the exposure system S4. The wafer W processed by the exposure system S4 is carried via the transfer stage for the interface block S3 of the unit block B3, B4 or B5, the transfer arm and the transfer stage of the unit block B1 (B2) to the unit block B1 (B2). The unit block B1 (B2) processes the wafer W by the developing process. Then, the wafer W processed by the developing process is carried to the transfer stage, the transfer arm the film forming unit block B3, B4 or B5 and the transfer stage for the carrier handling block S1 in that order an is returned via the transfer stage to the carrier handling block S1.

All the unit blocks B3 to B5 may be provided with transfer stages for the interface block S3. The transfer stages for the carrier handling block S1 and those for the interface block S3 may be formed in at least one of the film forming unit blocks B3 to B5 or may be formed in the different film forming unit blocks.

According to the present invention, the wafer W may be carried only to the developing unit blocks B1 and B2 for processing. The coating and developing system may be provided with a single layer of developing unit block. The film forming unit blocks BCT layer, the COT layer and the TCT layer may be stacked upward in that order. According to the present invention, the transfer stages of the shelf unit U5 capable of being accessed by the transfer arm C are not those of the DEV layers B1 and B2, and the transfer arm C may be capable of delivering the wafer W to and receiving the wafer W from at least one of the stacked unit blocks. Each of the shelf units U5 and U6 of each unit block may be provided with at least one transfer stage TRS. The transfer stage TRS may have a cooling function.

The unit block via which the wafer W is carried from the carrier handling unit S1 to the interface block S3 and is carried reversely may be provided with a carrying device for exclusively carrying the wafer W between the transfer arm C and the interface arm B or between the shelf units U5 and U6, in addition to the main arm A. The processing units of the stacked unit blocks B1 to B5 of the shelf units U5 and U6 may include an inspection unit. For example, the wafer edge exposure devices WEE of the COT layer B4 and the TCT layer B3 may be replaced with film thickness measuring devices, the DEV layers B1 and B2 may be provided with pattern alignment inspecting devices and faulty development detecting units, respectively. The unit blocks may be provided with inspection units, respectively. Inspection units may be disposed on the opposite sides of the carrying passage of the main arm A. A special unit block exclusively for inspection may be used.

The main arm A may be used in common for carrying the wafer W by the modules of the DEV layers B1 and B2. The present invention is applicable to coating and developing systems for processing substrates other than semiconductor wafers, such as glass substrates for liquid crystal displays (LCD substrates).

What is claimed is:

1. A coating and developing system comprising:
    a carrier handling block for receiving a substrate carried thereto by a carrier;
    a processing block for processing the substrate transferred thereto from the carrier handling block to form films including a resist film on the substrate;
    an interface block for carrying the substrate to an exposure system, receiving the substrate processed by the exposure system and returning the substrate to the processing block to subject the substrate to a developing process and to transfer the substrate processed by the developing process to the carrier handling block; wherein
    a) the processing block is provided with a plurality of film forming unit blocks stacked up in layers, and a developing unit block stacked up in layers with respect to the film forming unit blocks,
    b) the plurality of film forming unit blocks stacked up in layers include a liquid resist applying unit block for applying a liquid resist to the substrate, a liquid-processing unit block for applying a chemical solution for forming an antireflection film to the substrate before the liquid resist is applied to the substrate, and a liquid-processing unit block for applying a chemical solution for forming an antireflection film to the substrate after the liquid resist has been applied to the substrate;
    c) each of the unit blocks includes a liquid-processing unit for applying a chemical solution to the substrate, a heating unit for heating the substrate, a cooling unit for cooling the substrate, and a carrying means for carrying the substrate from one to another of the liquid-processing unit, the heating unit and the cooling unit; and
    d) the unit blocks are provided respectively with transfer stage groups, each of transfer stages stacked up in layers to transfer the substrate from one to another of the carrying means of the unit blocks, disposed on the side of the carrier handling block, and substrate transfer means for transferring the substrate from one to another of the transfer stages.

2. The coating and developing system according to claim 1, wherein the substrate coated with a film formed by the film forming unit block is transferred to the developing unit block by the substrate transfer means and is carried to the interface block by the carrying means of the developing unit block.

3. The coating and developing system according to claim 2 further comprising:
    carrying recipes specifying substrate carrying paths in the unit blocks; and
    a mode selecting means for selecting one of a first carrying mode in which a substrate is carried to all the unit blocks, a second carrying mode in which a substrate is carried to a liquid resist applying unit block, a liquid-processing unit block for forming an antireflection film before the liquid resist is applied to a substrate and a developing unit block for carrying out a developing process, and a third carrying mode in which a substrate is carried to a liquid resist applying unit block, a chemical solution applying unit block for applying a chemical solution for forming an antireflection film after the liquid resist has been applied to a substrate, and a developing unit block for carrying out a developing process;
    wherein the mode selecting means selects the unit blocks to which a substrate is to be carried and selects the carrying recipes for the selected unit blocks to process a substrate.

4. The coating and developing system according to claim 2, wherein the liquid-processing unit included in the film forming unit block has a plurality of laterally arranged substrate holding devices, respectively for holding a plurality of substrates, placed in a common processing vessel, and a common chemical solution applying nozzle for applying a chemical solution to substrates held by the plurality of substrate holding devices.

5. The coating and developing system according to claim 2, wherein an auxiliary block provided with functional units, which carries out processes after a film forming process and before an exposure process and/or after the exposure process and before the developing process and after the developing process, is interposed between the processing block and the interface block.

6. The coating and developing system according to claim 5, wherein the functional units of the auxiliary block include at least one of a film thickness examining unit for examining the thickness of a film formed on a substrate, a cleaning unit for cleaning a substrate before the exposure process and/or after the exposure process, a defocus inspecting device for finding a faultily registered pattern occurred in the exposure system, an irregular coating detecting device for detecting irregularities in a liquid resist film, a faulty development detecting device for detecting defects in a developed film, a particle counting device for counting particles adhering to a substrate, a comet detecting device for detecting comets in a resist film formed on a substrate, a splash-back detecting device, a defect detecting device for detecting defects in the surface of a substrate, a scum detecting device for detecting residual resist remaining on a substrate processed by a developing process, a defect detecting device for detecting defects caused by a liquid resist applying process and/or a developing process, a line width measuring device for measuring lines of a patterned resist film formed on a substrate, and a register examining device for examining the register of a photomask on a substrate after an exposure process.

7. The coating and developing system according to claim 5, wherein the exposure system forms a liquid layer on the surface of a substrate for immersion exposure, and the functional unit of the auxiliary block is a cleaning unit for cleaning a substrate processed by immersion exposure.

8. The coating and developing system according to claim 7, wherein a protective film forming unit block for forming a water-repellent protective film over a resist film formed on a substrate is laid on the plurality of stacked film forming unit blocks.

9. The coating and developing system according to claim 2, wherein the plurality film forming unit blocks are the same in the layout of the liquid-processing unit, the heating unit, the cooling unit and the carrying means.

10. The coating and developing system according to claim 1 further comprising:
    carrying recipes specifying substrate carrying paths in the unit blocks; and
    a mode selecting means for selecting one of a first carrying mode in which a substrate is carried to all the unit blocks, a second carrying mode in which a substrate is carried to a liquid resist applying unit block, a liquid-processing unit block for forming an antireflection film before the liquid resist is applied to a substrate and a developing unit block for carrying out a developing process, and a third carrying mode in which a substrate is carried to a liquid resist applying unit block, a chemical solution applying unit block for applying a chemical solution for forming an antireflection film after the liquid resist has been applied to a substrate, and a developing unit block for carrying out a developing process;
    wherein the mode selecting means selects the unit blocks to which a substrate is to be carried and selects the carrying recipes for the selected unit blocks to process a substrate.

11. The coating and developing system according to claim 1, wherein the liquid-processing unit included in the film forming unit block has a plurality of laterally arranged substrate holding devices, respectively for holding a plurality of substrates, placed in a common processing vessel, and a common chemical solution applying nozzle for applying a chemical solution to substrates held by the plurality of substrate holding devices.

12. The coating and developing system according to claim 1, wherein an auxiliary block provided with functional units, which carries out processes after a film forming process and before an exposure process and/or after the exposure process and before the developing process and after the developing process, is interposed between the processing block and the interface block.

13. The coating and developing system according to claim 12, wherein the functional units of the auxiliary block include at least one of a film thickness examining unit for examining the thickness of a film formed on a substrate, a cleaning unit for cleaning a substrate before the exposure process and/or after the exposure process, a defocus inspecting device for finding a faultily registered pattern occurred in the exposure system, an irregular coating detecting device for detecting irregularities in a liquid resist film, a faulty development detecting device for detecting defects in a developed film, a particle counting device for counting particles adhering to a substrate, a comet detecting device for detecting comets in a resist film formed on a substrate, a splash-back detecting device, a defect detecting device for detecting defects in the surface of a substrate, a scum detecting device for detecting residual resist remaining on a substrate processed by a developing process, a defect detecting device for detecting defects caused by a liquid resist applying process and/or a developing process, a line width measuring device for measuring lines of a patterned resist film formed on a substrate, and a register examining device for examining the register of a photomask on a substrate after an exposure process.

14. The coating and developing system according to claim 12, wherein the exposure system forms a liquid layer on the surface of a substrate for immersion exposure, and the functional unit of the auxiliary block is a cleaning unit for cleaning a substrate processed by immersion exposure.

15. The coating and developing system according to claim 14, wherein a protective film forming unit block for forming a water-repellent protective film over a resist film formed on a substrate is laid on the plurality of stacked film forming unit blocks.

16. The coating and developing system according to claim 1, wherein the plurality film forming unit blocks are the same in the layout of the liquid-processing unit, the heating unit, the cooling unit and the carrying means.

17. A coating and developing system comprising:
    a carrier handling block for receiving a substrate carried thereto by a carrier;
    a processing block for processing the substrate transferred thereto from the carrier handling block to form films including a resist film on the substrate;
    an interface block for carrying the substrate to an exposure system, receiving the substrate processed by the exposure system and returning the substrate to the processing block to subject the substrate to a developing process and to transfer the substrate processed by the developing process to the carrier handling block; wherein
    a) the processing block is provided with a plurality of film forming unit blocks stacked up in layers and a developing unit block put on the film forming unit blocks,
    b) the plurality of film forming unit blocks stacked up in layers include a liquid resist applying unit block for applying a liquid resist to the substrate, a liquid-processing unit block for applying a chemical solution for forming an antireflection film to the substrate before the liquid resist is applied to the substrate, and a liquid-processing unit block for applying a chemical solution for forming an antireflection film to the substrate after the liquid resist has been applied to the substrate;
    c) each of the unit blocks includes a liquid-processing unit for applying a chemical solution to the substrate, a heating unit for heating the substrate, a cooling unit for cooling the substrate, and a carrying means for carrying the substrate from one to another of the liquid-processing unit, the heating unit and the cooling unit; and
    d) the unit blocks are provided respectively with transfer stage groups, each of transfer stages stacked up in layers to transfer the substrate from one to another of the carrying means of the unit blocks, disposed on the side of the interface block, and substrate transfer means for transferring the substrate from one to another of the transfer stages.

18. The coating and developing system according to claim 17, wherein a substrate contained in and delivered to the carrier handling block is transferred to the developing unit block and then the substrate is transferred to the film forming unit block by a substrate transfer means.

19. The coating and developing system according to claim 17 further comprising:
- carrying recipes specifying substrate carrying paths in the unit blocks; and
- a mode selecting means for selecting one of a first carrying mode in which a substrate is carried to all the unit blocks, a second carrying mode in which a substrate is carried to a liquid resist applying unit block, a liquid-processing unit block for forming an antireflection film before the liquid resist is applied to a substrate and a developing unit block for carrying out a developing process, and a third carrying mode in which a substrate is carried to a liquid resist applying unit block, a chemical solution applying unit block for applying a chemical solution for forming an antireflection film after the liquid resist has been applied to a substrate, and a developing unit block for carrying out a developing process;
- wherein the mode selecting means selects the unit blocks to which a substrate is to be carried and selects the carrying recipes for the selected unit blocks to process a substrate.

20. The coating and developing system according to claim 17, wherein the liquid-processing unit included in the film forming unit block has a plurality of laterally arranged substrate holding devices, respectively for holding a plurality of substrates, placed in a common processing vessel, and a common chemical solution applying nozzle for applying a chemical solution to substrates held by the plurality of substrate holding devices.

21. The coating and developing system according to claim 17, wherein an auxiliary block provided with functional units, which carries out processes after a film forming process and before an exposure process and/or after the exposure process and before the developing process and after the developing process, is interposed between the processing block and the interface block.

22. The coating and developing system according to claim 21, wherein the functional units of the auxiliary block include at least one of a film thickness examining unit for examining the thickness of a film formed on a substrate, a cleaning unit for cleaning a substrate before the exposure process and/or after the exposure process, a defocus inspecting device for finding a faultily registered pattern occurred in the exposure system, an irregular coating detecting device for detecting irregularities in a liquid resist film, a faulty development detecting device for detecting defects in a developed film, a particle counting device for counting particles adhering to a substrate, a comet detecting device for detecting comets in a resist film formed on a substrate, a splash-back detecting device, a defect detecting device for detecting defects in the surface of a substrate, a scum detecting device for detecting residual resist remaining on a substrate processed by a developing process, a defect detecting device for detecting defects caused by a liquid resist applying process and/or a developing process, a line width measuring device for measuring lines of a patterned resist film formed on a substrate, and a register examining device for examining the register of a photomask on a substrate after an exposure process.

23. The coating and developing system according to claim 21, wherein the exposure system forms a liquid layer on the surface of a substrate for immersion exposure, and the functional unit of the auxiliary block is a cleaning unit for cleaning a substrate processed by immersion exposure.

24. The coating and developing system according to claim 23, wherein a protective film forming unit block for forming a water-repellent protective film over a resist film formed on a substrate is laid on the plurality of stacked film forming unit blocks.

25. The coating and developing system according to claim 23, wherein the plurality film forming unit blocks are the same in the layout of the liquid-processing unit, the heating unit, the cooling unit and the carrying means.

26. A coating and developing method to be carried out by a coating and developing system comprising:
- a carrier handling block for receiving a substrate carried thereto by a carrier;
- a processing block for processing the substrate transferred thereto from the carrier handling block to form films including a resist film on the substrate;
- an interface block for carrying the substrate to an exposure system, receiving the substrate processed by the exposure system and returning the substrate to the processing block to subject the substrate to a developing process and to transfer the substrate processed by the developing process to the carrier handling block; wherein
- a) the processing block is provided with a plurality of film forming unit blocks stacked up in layers and a developing unit block stacked up in layers with respect to the film forming unit blocks,
- b) the plurality of film forming unit blocks stacked up in layers include a liquid resist applying unit block for applying a liquid resist to the substrate, a liquid-processing unit block for applying a chemical solution for forming an antireflection film to the substrate before the liquid resist is applied to the substrate, and a liquid-processing unit block for applying a chemical solution for forming an antireflection film to the substrate after the liquid resist has been applied to the substrate;
- c) each of the unit blocks includes a liquid-processing unit for applying a chemical solution to the substrate, a heating unit for heating the substrate, a cooling unit for cooling the substrate, and a carrying means for carrying the substrate from one to another of the liquid-processing unit, the heating unit and the cooling unit; and
- d) the unit blocks are provided respectively with transfer stage groups, each of transfer stages stacked up in layers to transfer the substrate from one to another of the carrying means of the unit blocks, disposed on the side of the carrier handling block, and substrate transfer means for transferring the substrate from one to another of the transfer stages, said coating and developing method comprising the steps of:
- forming a first antireflection film on a surface of a substrate by the film forming unit block;
- forming a resist film by applying a liquid resist to the first antireflection film formed on the surface of the substrate by the film forming unit block different from that formed by the first antireflection film;
- forming a second antireflection film over the resist film by the film forming unit block different from that formed by the resist film; and
- subjecting the substrate coated with the resist film and processed by an exposure process to a developing process by the developing unit block included in the layer other than that including the film forming unit blocks.

27. A coating and developing method to be carried out by a coating and developing system comprising:
- a carrier handling block for receiving a substrate carried thereto by a carrier;
- a processing block for processing the substrate transferred thereto from the carrier handling block to form films including a resist film on the substrate;
- an interface block for carrying the substrate to an exposure system, receiving the substrate processed by the exposure system and returning the substrate to the processing block to subject the substrate to a developing process and to transfer the substrate processed by the developing process to the carrier handling block; wherein
- a) the processing block is provided with a plurality of film forming unit blocks stacked up in layers and a developing unit block stacked up in layers with respect to the film forming unit blocks,
- b) the plurality of film forming unit blocks stacked up in layers include a liquid resist applying unit block for applying a liquid resist to the substrate, a liquid-processing unit block for applying a chemical solution for forming an antireflection film to the substrate before the liquid resist is applied to the substrate, and a liquid-processing unit block for applying a chemical solution for forming an antireflection film to the substrate after the liquid resist has been applied to the substrate;
- c) each of the unit blocks includes a liquid-processing unit for applying a chemical solution to the substrate, a heating unit for heating the substrate, a cooling unit for cooling the substrate, and a carrying means for carrying the substrate from one to another of the liquid-processing unit; and
- d) the unit blocks are provided respectively with transfer stage groups, each of transfer stages stacked up in layers to transfer the substrate from one to another of the carrying means of the unit blocks, disposed on the side of the carrier handling block, and substrate transfer means for transferring the substrate from one to another of the transfer stages, said coating and developing method comprising the steps of:

selecting one of a first carrying mode in which a substrate is carried to all the unit blocks, a second carrying mode in which a substrate is carried to a liquid resist applying unit block and a liquid-processing unit block for forming an antireflection film before the liquid resist is applied to a substrate, and a third carrying mode in which a substrate is carried to a liquid resist applying unit block and a chemical solution applying unit block for applying a chemical solution for forming an antireflection film after the liquid resist has been applied to a substrate;

carrying the substrate sequentially to the film forming unit blocks to be used in the selected mode to form films on the substrate; and subjecting the substrate coated with the films and processed by an exposure process to a developing process by the developing unit block included in the layer other than that including the film forming unit blocks.

* * * * *